United States Patent [19]

Murakami et al.

[11] Patent Number: 5,438,303

[45] Date of Patent: Aug. 1, 1995

[54] PULSE WITH MODULATION APPARATUS WITH PLURAL INDEPENDABLY CONTROLLABLE VARIABLE DELAY DEVICES

[75] Inventors: Daisuke Murakami; Hideki Yoshida; Takao Terao, all of Kanagawa, Japan

[73] Assignee: Sony Corporation, Tokyo, Japan

[21] Appl. No.: 89,566

[22] Filed: Jul. 12, 1993

[30] Foreign Application Priority Data

| Jul. 14, 1992 | [JP] | Japan | 4-210819 |
| Dec. 29, 1992 | [JP] | Japan | 4-360286 |
| Dec. 29, 1992 | [JP] | Japan | 4-361516 |
| Dec. 29, 1992 | [JP] | Japan | 4-361546 |
| Dec. 30, 1992 | [JP] | Japan | 4-360616 |

[51] Int. Cl.$^6$ .............................. H03K 7/08
[52] U.S. Cl. .................... 332/109; 332/110; 327/172; 375/238
[58] Field of Search .............. 332/109, 110, 111; 375/22; 327/172; 346/108; 358/296, 300

[56] References Cited

U.S. PATENT DOCUMENTS

| 5,119,045 | 6/1992 | Sato | 332/109 |
| 5,191,234 | 3/1993 | Murakami et al. | 327/172 |

*Primary Examiner*—David Mis
*Attorney, Agent, or Firm*—Hill, Steadman & Simpson

[57] ABSTRACT

A pulse width modulation apparatus outputs an output pulse having an arbitrary width with respect to an arbitrary point in a pulse period. A delay means associated with a pulse cycle have multi-stage delay output means. Before a control pulse CLKP is fed to each of multi-stage delay output means, a delay time for the delay output means can be set. A rising or falling to be latched by a latch means is controlled based on delay control pulses obtained by the delay output means. An output pulse having an arbitrary pulse width with respect to an arbitrary point can be supplied without occurrence of an offset pulse or a blank duration at the start of each pulse duration.

27 Claims, 33 Drawing Sheets

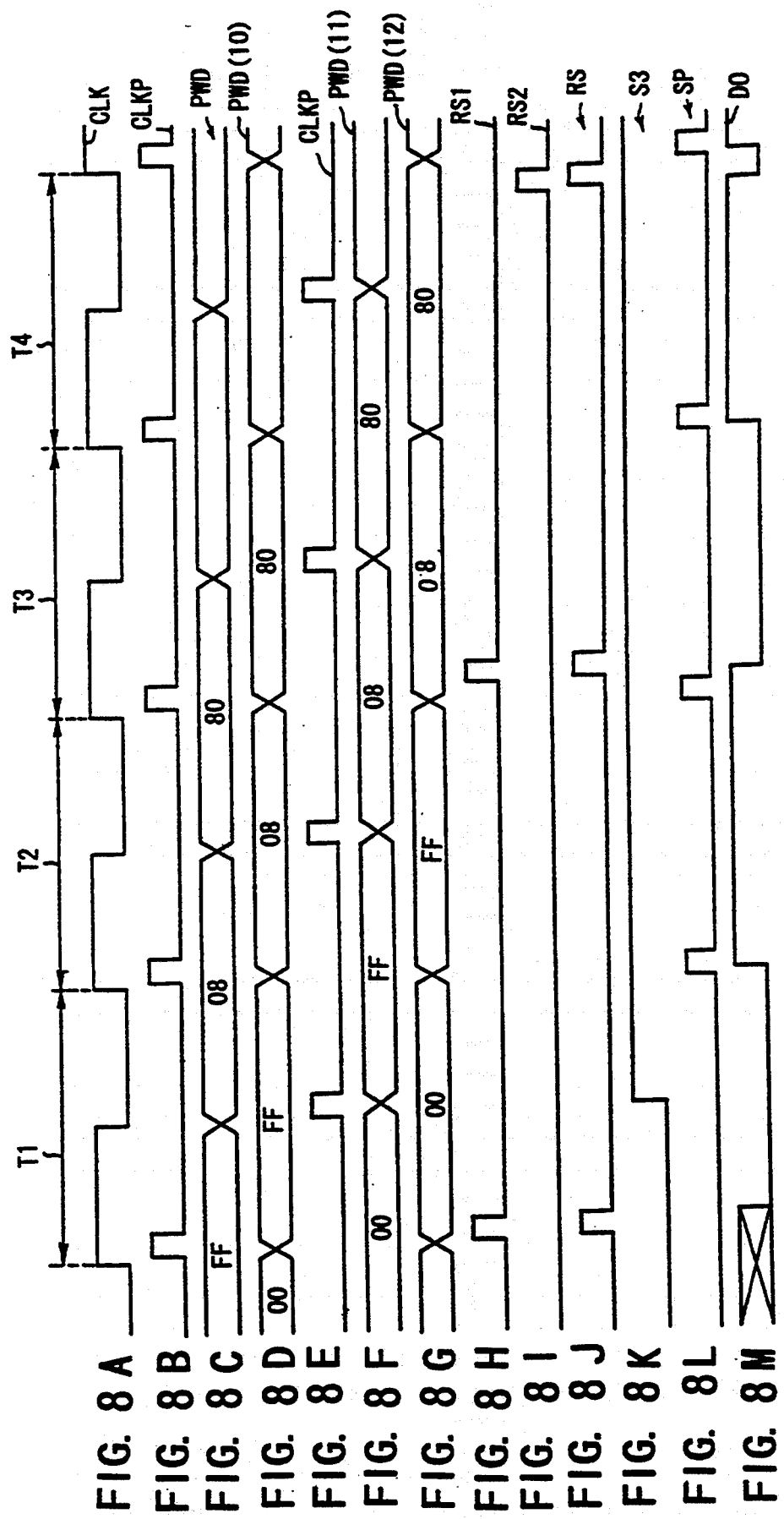

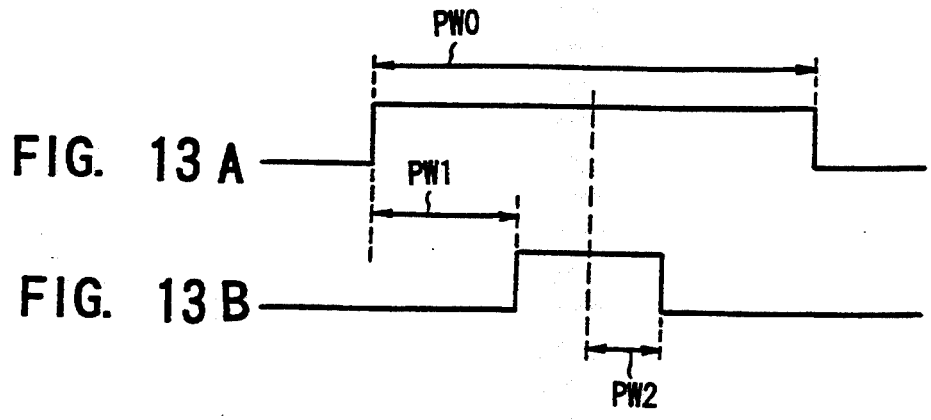
FIG. 13 A
FIG. 13 B
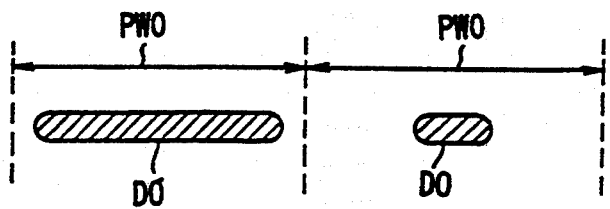
FIG. 16

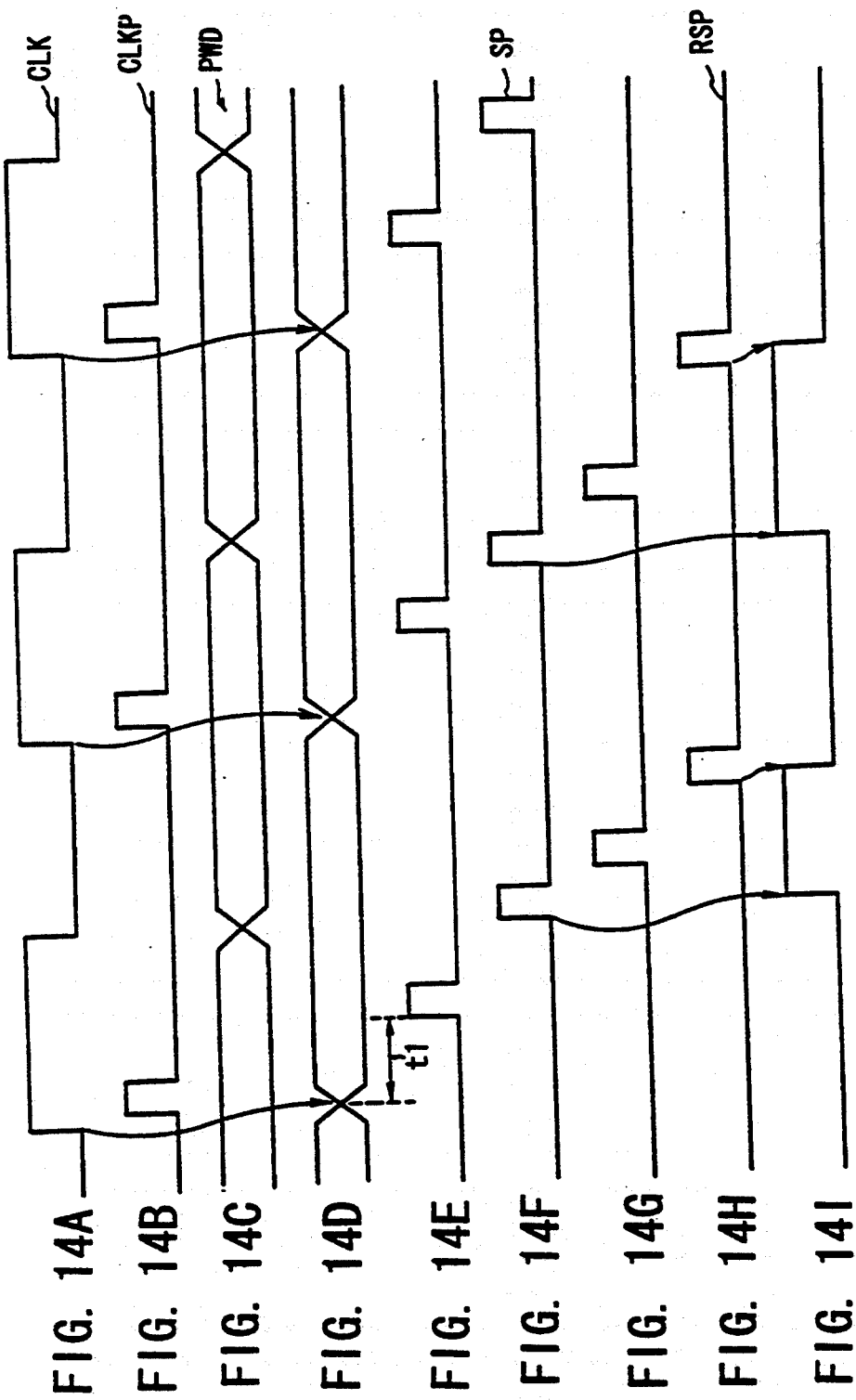

M

S

R

SC

SB

SD

SE

Q

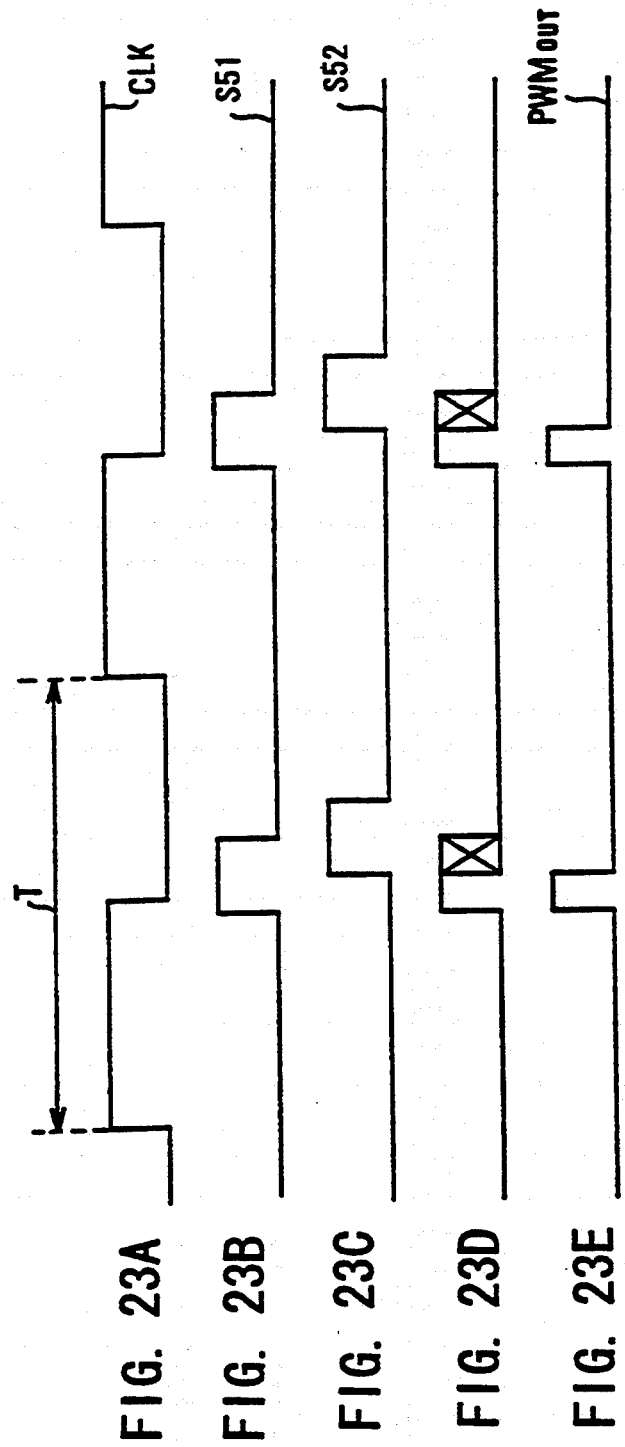

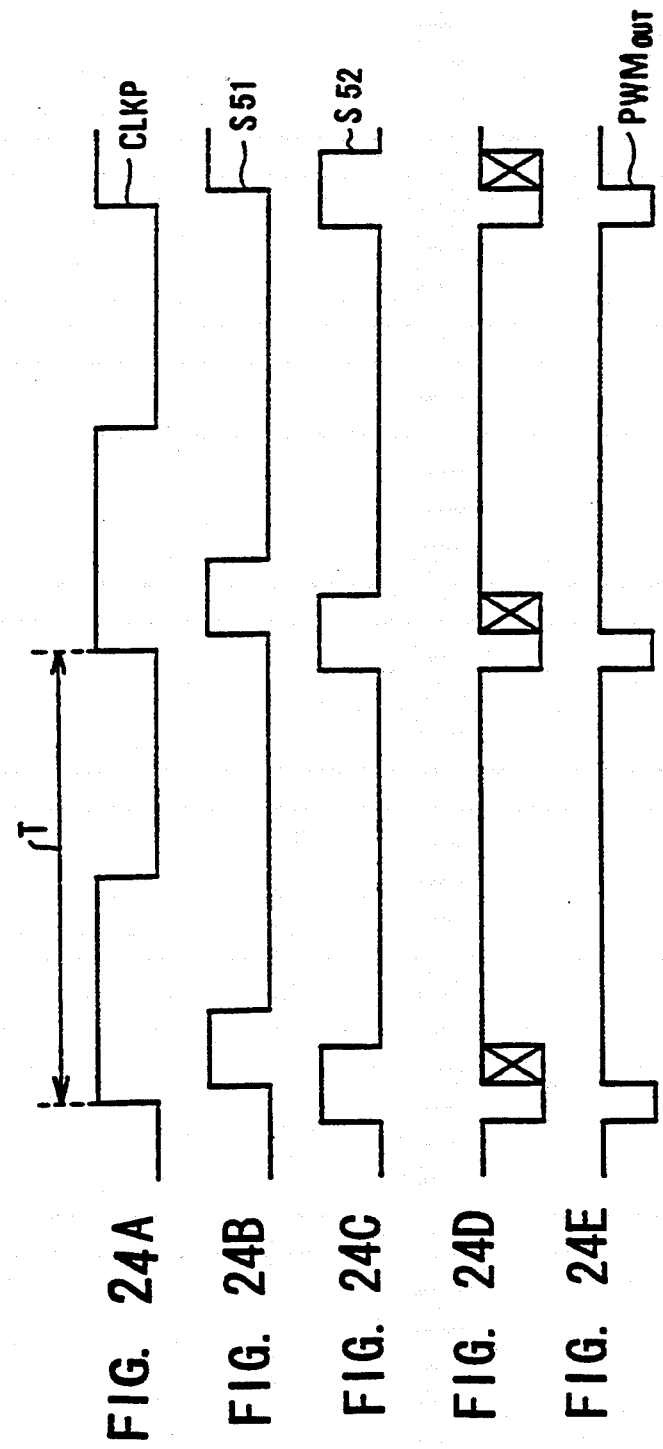

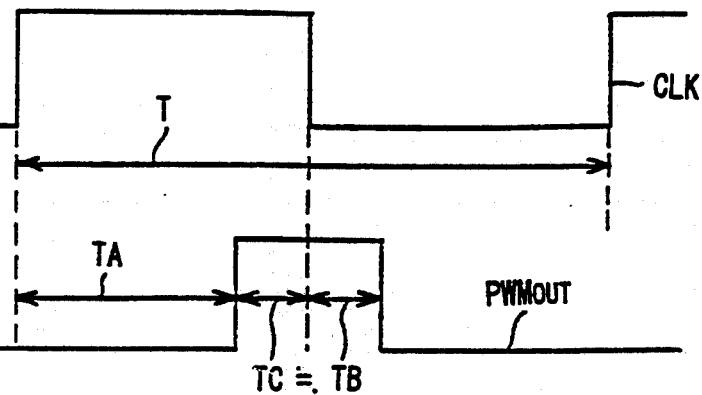
FIG. 26A
FIG. 26B
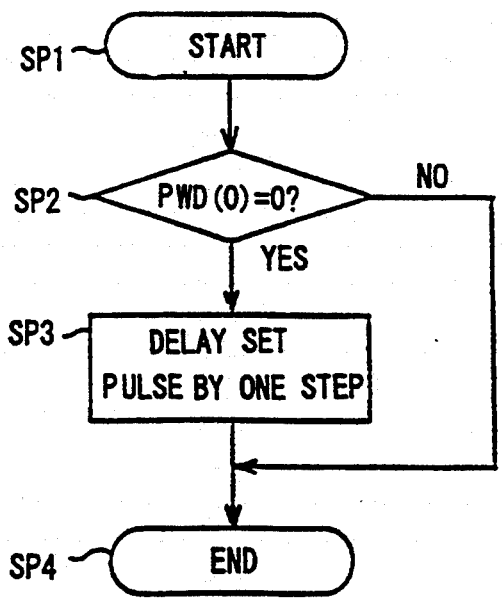
FIG. 28

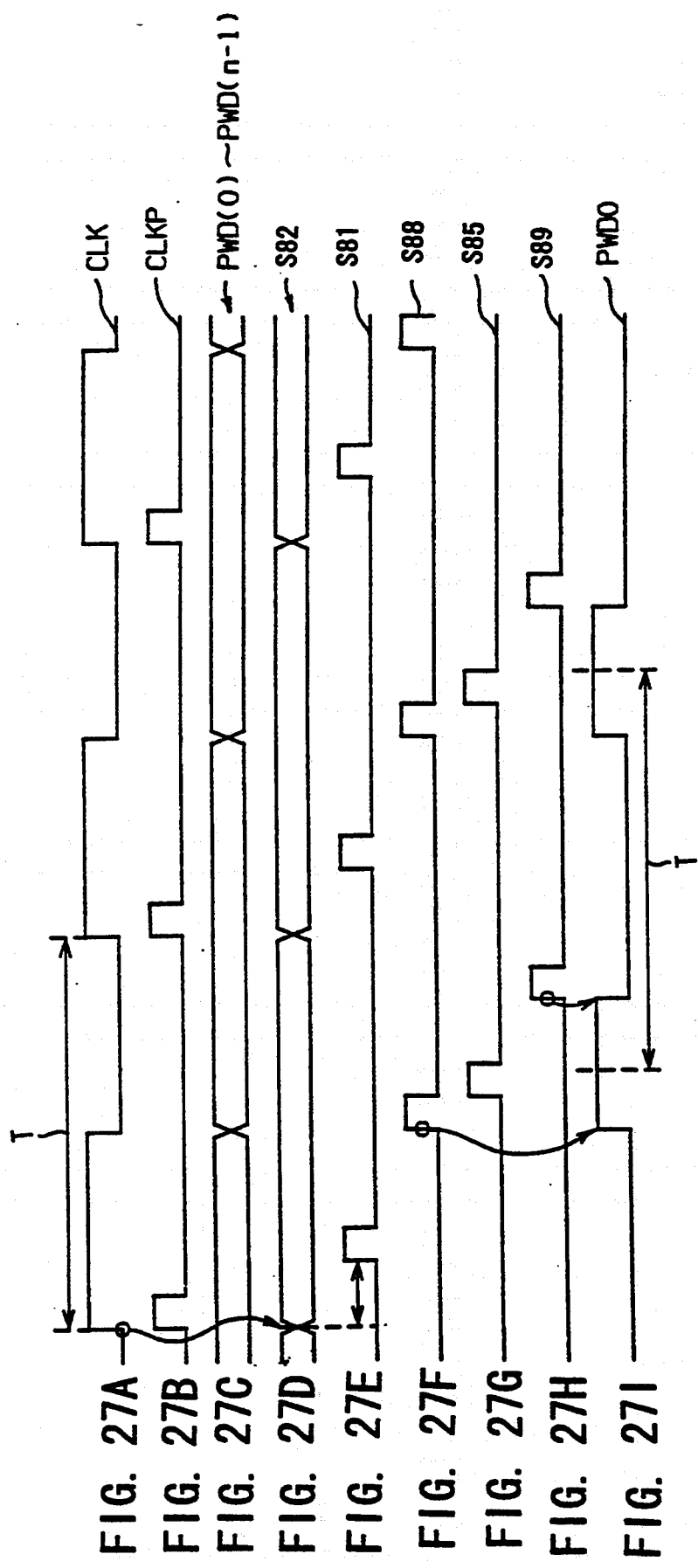

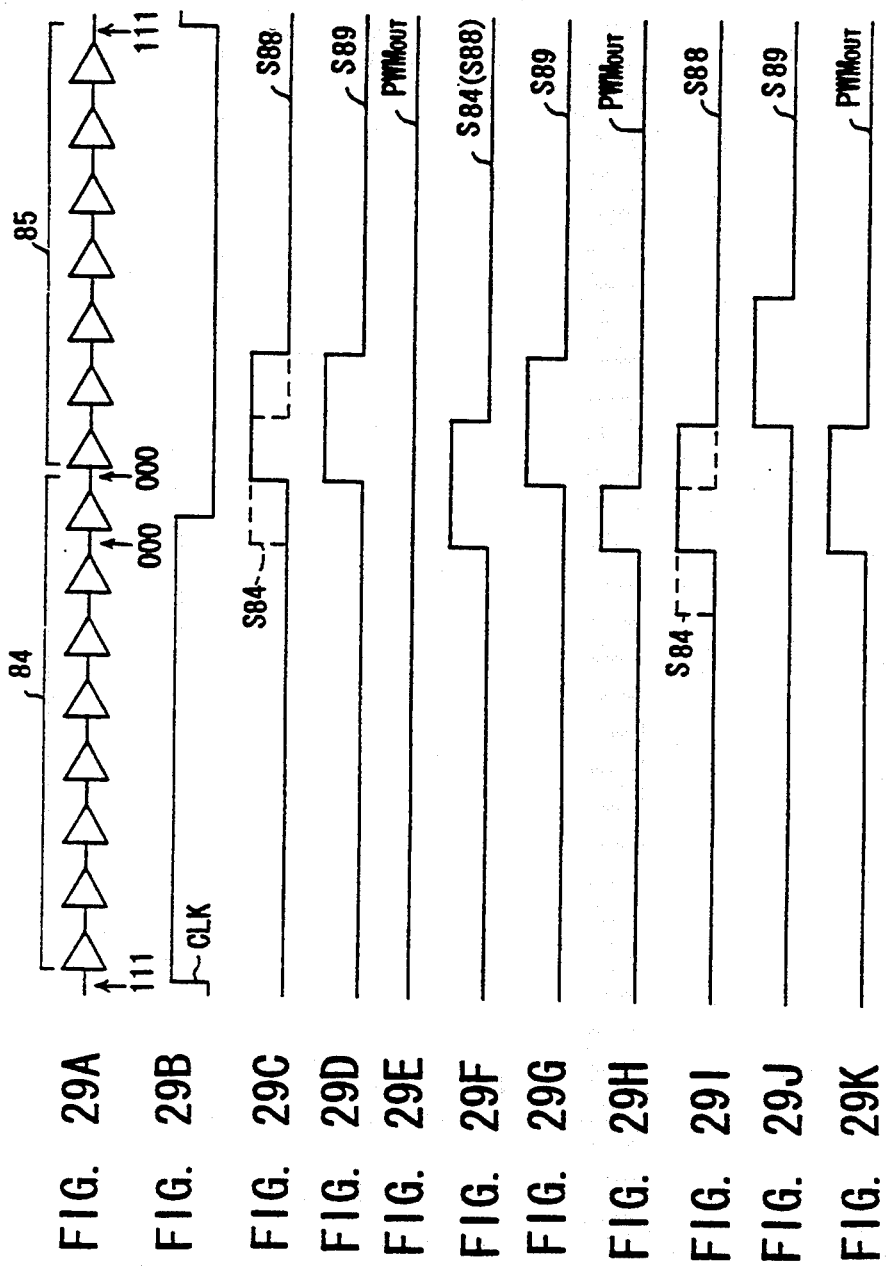

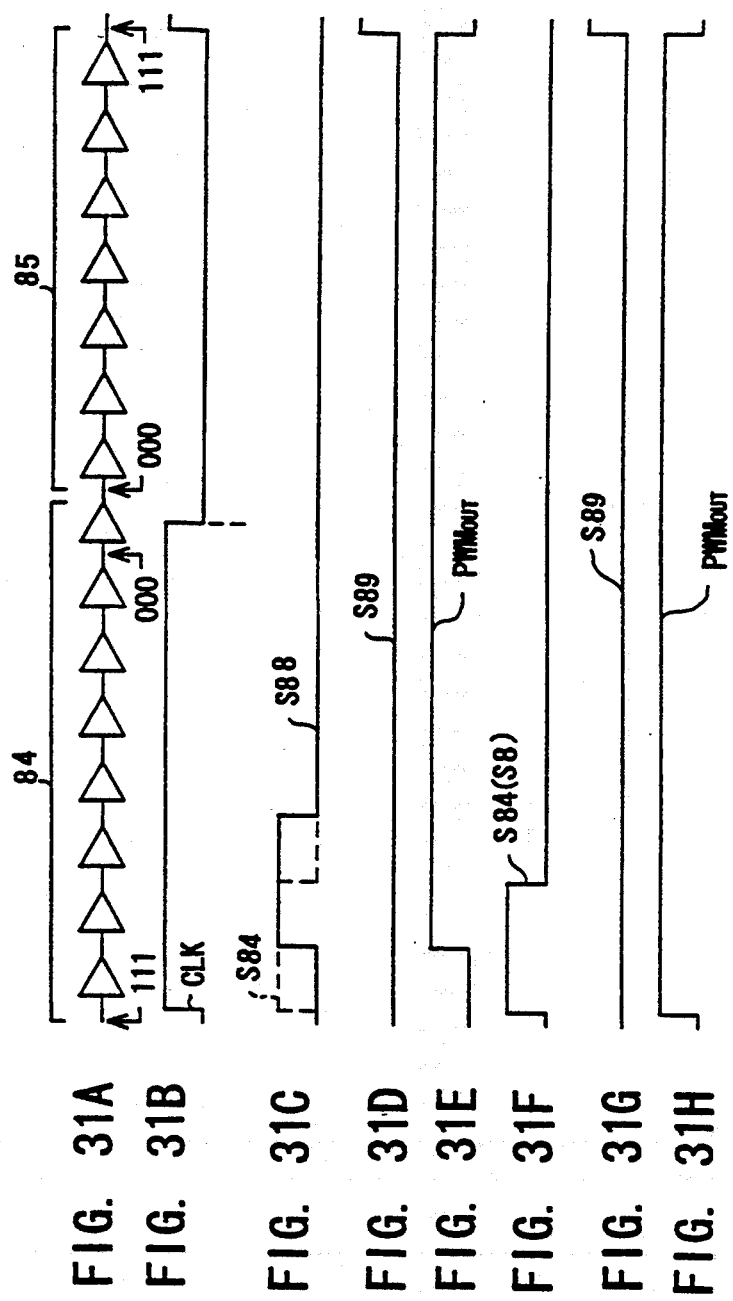

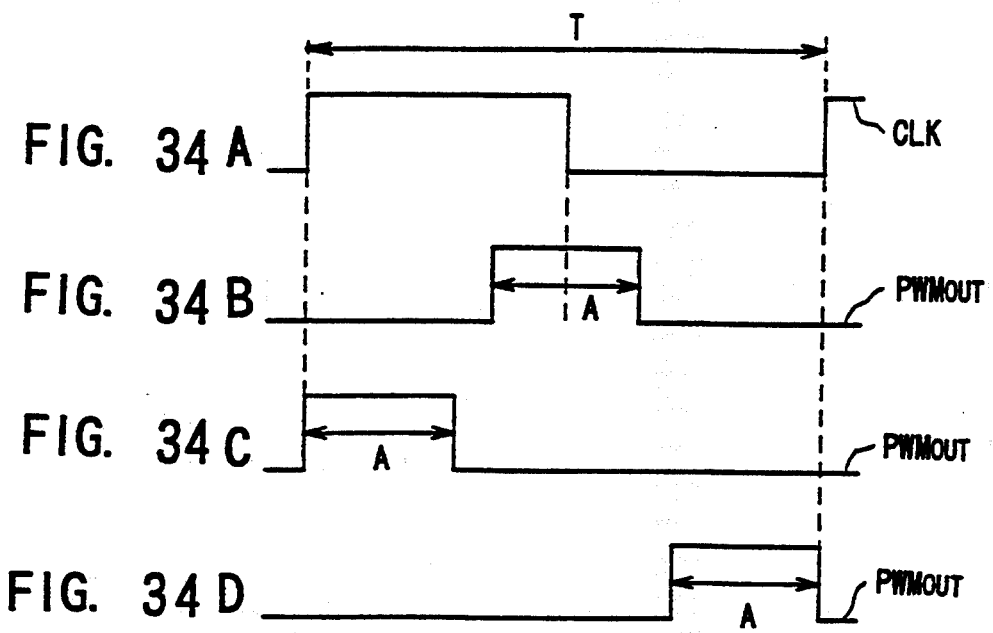
FIG. 34 A
FIG. 34 B
FIG. 34 C
FIG. 34 D
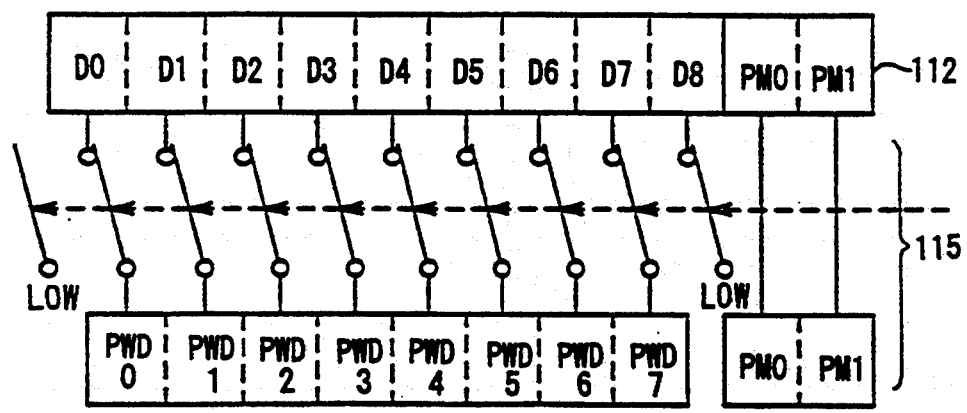
FIG. 37

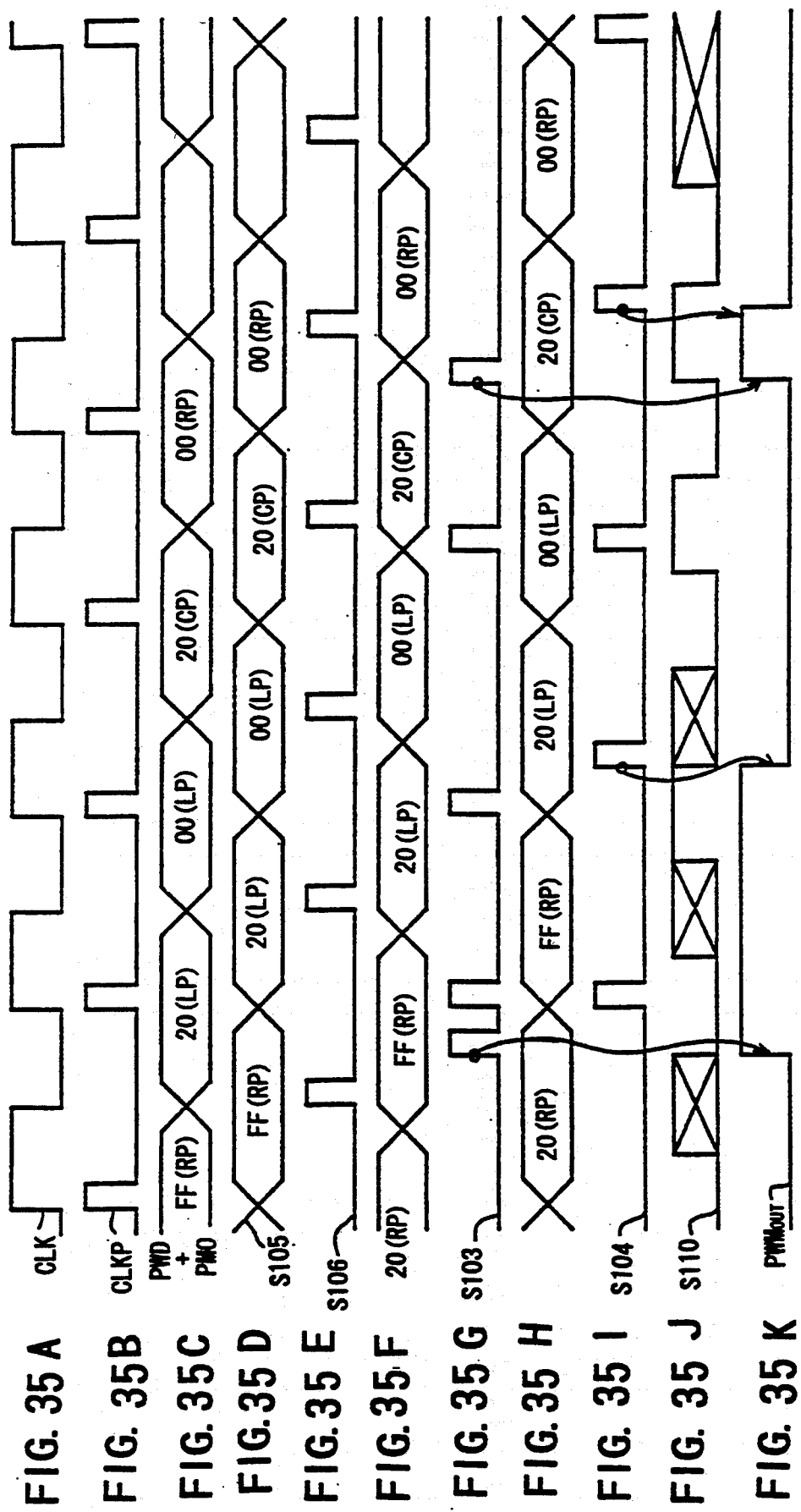

FIG. 36A  CLK
FIG. 36B
123   124
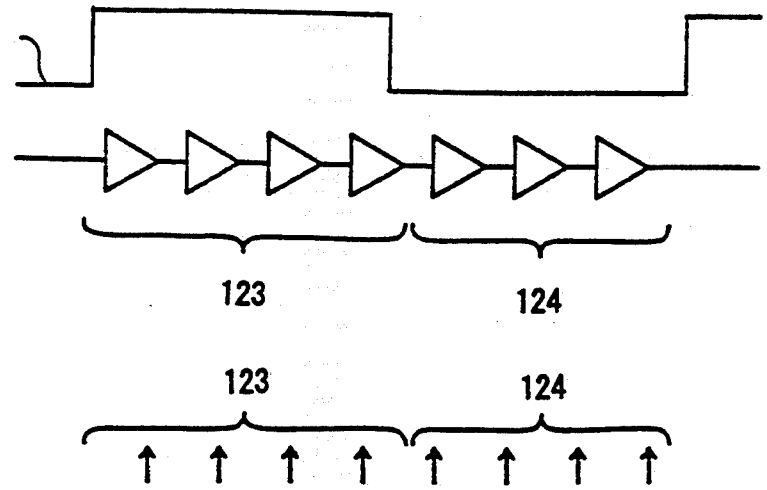
FIG. 36C  CP
FIG. 36D  LP
FIG. 36E  RP FIG. 39B CP MODE 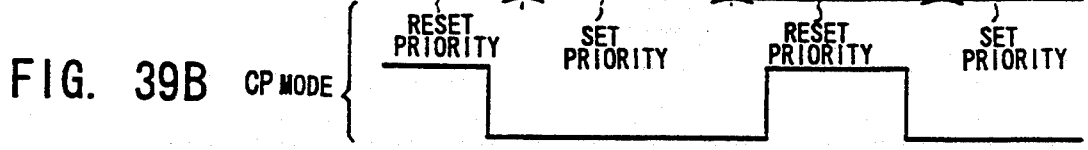
FIG. 39C LP MODE 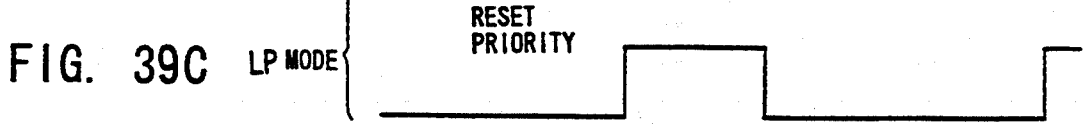
FIG. 39D RP MODE 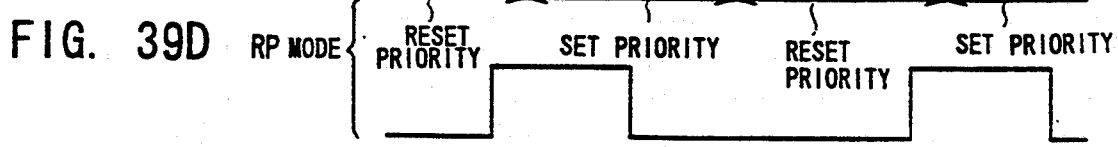

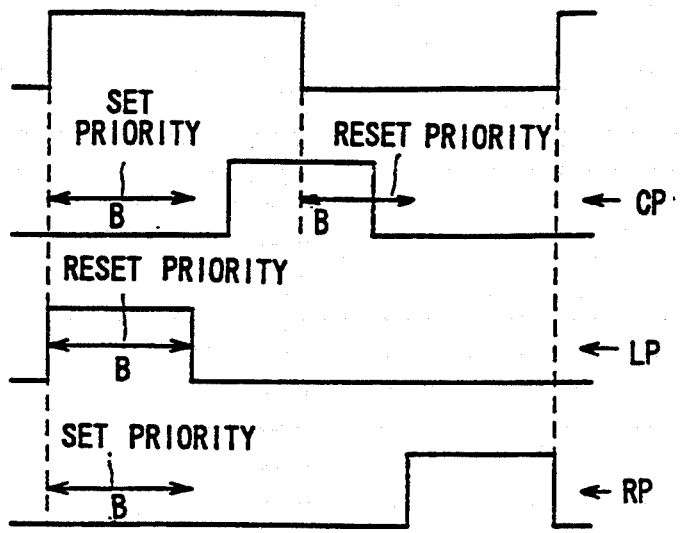
FIG. 40A
FIG. 40B ← CP
FIG. 40C ← LP
FIG. 40D ← RP
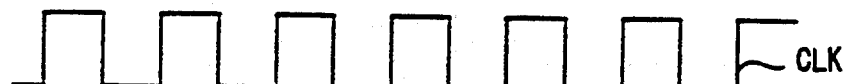
FIG. 41A  CLK
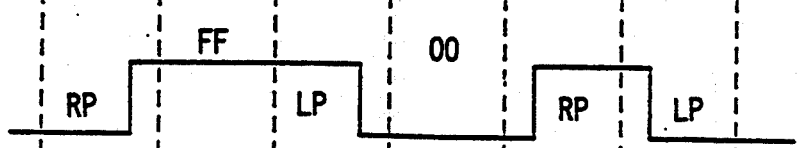
FIG. 41B
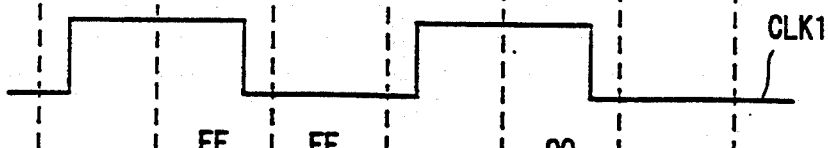
FIG. 41C  CLK1
FIG. 41D
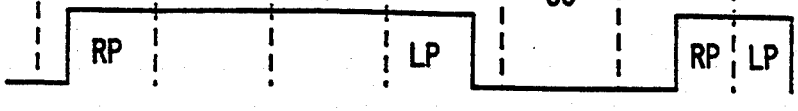
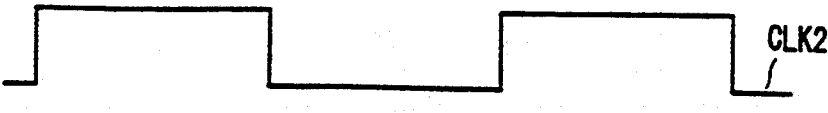
FIG. 41E  CLK2

PULSE WITH MODULATION APPARATUS WITH PLURAL INDEPENDABLY CONTROLLABLE VARIABLE DELAY DEVICES

BACKGROUND OF THE INVENTION

1. Field of the Invention

This invention relates to a pulse width modulation apparatus and is applicable to, for example, a laser-beam printer.

2. Description of the Related Art

Laser-beam printers have been widely used as printers for printing arbitrary characters and graphics with high quality, in which output information corresponding to characters and graphics is written onto a photoconductive drum by a laser beam and then an image written on the photoconductive drum is printed on a paper by means of electrophotography.

In general, as shown in FIGS. 1 to 4, this kind of laser-beam printer has a built-in pulse generator for controlling the rising and falling timing of an output pulse. For example a laser pulse DO, which rises at intervals of a pulse cycle T, is let fall according to the timing specified in setting data, thus adjusting the pulse width to express the tone.

In other words, the pulse generator decodes 8-bit selection data to specify a falling point in 255 (=eighth power of 2 minus 1) unit pulses P1 to P255, which constitute a maximum output pulse width PW0 (pulse width set when a laser beam is output over the entire duration of a pulse cycle T), and thus provides an output pulse of an arbitrary pulse width (FIG. 1).

A falling point of a laser pulse DO is specified by selecting one of delay outputs provided by 255-stage delay elements connected in series with one another via output terminals thereof. For selection of a delay output, programmable delay circuits are usually used.

When an attempt is made to specify a falling point of an output pulse, which is generated at intervals of a pulse cycle T, using the programmable delay circuits, a certain period of time $\Delta t$ is required to decode selection data. Despite the absence of an output pulse, an output pulse may be supplied for a certain period of time $\Delta t$ from the start of each duration (FIG. 2). On the contrary, despite the presence of an output pulse, no output pulse may be supplied for a certain period of time $\Delta t$ (FIG. 3).

For effective use of a maximum output pulse width PW0, multi-stage delay circuits each having 255-stage delay elements connected in series with one another are lined in parallel with one another. The multi-stage delay circuits are operated complimentarily, thus preserving the time required for decoding. This idea, however, requires multi-stage delay circuits having the same performance, which leads to an increase in the number of elements or power consumption.

In the foregoing kind of laser-beam printer, a tone is expressed depending on the pulse width of an output pulse. When an output pulse having a large pulse width is succeeded by an output pulse having a small pulse width (FIG. 4), the output pulse having a short pulse width is incorrectly seen as part of the output pulse having a large pulse width. Thus, the tone cannot be exhibited correctly.

Further, when the pulse width modulation apparatus using an RS-FF circuit (reset/set flip-flop circuit) is employed in digital copying machines and laser-beam printers, an attempt to reproduce image gradation with higher fidelity requires generation of an output pulse having a narrower width than the control pulse, or generation of two successive output pulses with a small gap left therebetween.

Stated otherwise, an attempt to generate an output pulse having a narrower width than the set pulse and the reset pulse applied to the RS-FF circuit has raised the problem that there occur an overlap of durations in which the set pulse and the reset pulse both take the logic "H" level, thus making the RS-FF circuit fail to operate normally.

Also, an attempt to generate output pulses having a wider width in succession than the set pulse and the reset pulse applied to the RS-FF circuit has raised the problem that spans in which the set pulse and the reset pulse take the logic "H" level overlap with each other in the boundary region between the current pulse cycle and the succeeding pulse cycle, thus similarly making the RS-FF circuit fail to operate normally.

This has accompanied a fear that image quality deteriorates in the boundary region between the two output pulses.

While it is contemplated to give priority to either one of the set pulse and the reset pulse, the method cannot solve the two above mentioned problems at the same time. Specifically, if the priority is set to generate an output pulse of narrow pulse width, image gradation deteriorates in the boundary region between adjacent output pulses. On the contrary, if the priority is set to produce a normal output in the boundary region between adjacent output pulses, a narrow output pulse cannot be generated.

In such a pulse width modulation apparatus, however, timing control of rising and falling of the output pulse is performed by such processing as to determine respective complements on several high-order bits and the least significant bit of pulse width setting data, and then determine the sum of those complements, resulting in the problems that an adder occupies the pulse width modulation apparatus to a large extent and the time required for computations is prolonged.

All the reference points of output pulses are set to the start points of clock cycles (i.e. on the left side), when an output pulse with a pulse width over a plurality of cycles is to be generated. A problem arises in that an output image is deteriorated with respect to an original image desired to be printed, and the like. For example, when an output pulse slightly longer than a single clock cycle is intended to be output over three successive clock cycles T1, T2 and T3, a figure represented by a single line in an original image may be reproduced by the pulse width modulation circuit as an image deteriorated in quality due to a space produced between the pulse generated at the first clock pulse T1 corresponding to the left portion of the figure and the pulse generated at the second clock cycle T2 corresponding to the main portion of the figure.

Further, when the reference point is fixed to the intermediate point or end point (i.e., on the right side) of the clock cycle, an image is also deteriorated in quality by the same reason. It is contemplated to generate a delay time longer than the clock cycle by increasing a delay line to prevent the deterioration of the image quality. This, however, leads to an increase in a power consumption and circuit size.

In such a pulse width modulation apparatus, set and reset pulses to be supplied to RS-FF circuit are generated by a programmable delay circuit to provide an output pulse which rises and falls at selected timings.

However, delay time of a delay gate in the programmable delay circuit may fluctuate due to production variance of the integrated circuits or operational environment (operation temperature, source voltage, etc.).

For example, if delay time per one stage of delay gate becomes too long, the delay time of a group of delay gates as a whole should coincide the cycle of a clock pulse becomes longer than the cycle of the clock pulse. As a result, even if a pulse width setting data is provided to make the pulse width of the output pulse to be slightly shorter than the maximum value, it is possible that the pulse width of the output pulse which is actually output may be longer than the ideal pulse width or that the RS-FF circuit is brought into its undefined state because a set pulse for the next cycle is already output by the time at which a reset pulse is output.

On the other hand, if delay time per one stage of delay gate becomes shorter, the pulse width of the output pulse becomes shorter than the ideal pulse width whereby a blank period occurs in the pulse width which should be formed in a manner extending over two clock cycles, resulting in a problem that a stable graduated representation becomes impossible.

Further, since adjusting of the pulse width is also impossible because the delay time of each delay gate once fabricated cannot be adjusted, it may be used only with a certain clock cycle.

SUMMARY OF THE INVENTION

In view of the foregoing, the first object of this invention is to provide a pulse width modulation apparatus capable of preventing creation of a blank duration in an output pulse or occurrence of an offset pulse and exhibiting a tone correctly using a limited number of elements.

The second object of this invention is to provide a pulse width modulation apparatus capable of achieving an accurate graduated representation irrespective of fluctuation in operational environment.

The third object of this invention is to provide a pulse width modulation apparatus which can generate an output pulse narrower than a control pulse with the simpler configuration than conventional.

The fourth object of this invention is to provide a pulse width modulation apparatus which requires a shorter processing time and the smaller number of devices for computing the rising timing and the falling timing of an output pulse.

The fifth object of this invention is to provide a pulse width modulation apparatus capable of easily generating a pulse width having a cycle longer than a clock cycle without increasing a power consumption and circuit size.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 8A to 8M are timing charts explaining operations of processing circuits shown in FIG. 5;

FIGS. 13A and 13B are signal waveforms illustrating an output pulse provided by the second embodiment;

FIGS. 14A to 14I are timing charts explaining operations of processing circuits shown in FIG. 11;

FIG. 16 is a schematic diagram showing output pulses provided by the second embodiment;

FIGS. 23A to 23E are signal waveforms explaining an operation of the RS-FF circuit in a reset pulse priority mode;

FIGS. 24A to 24E are signal waveforms explaining an operation of the RS-FF circuit in a set pulse priority mode;

FIGS. 26A and 26B are signal waveforms showing the relationship between a clock signal and an output pulse of the pulse width modulation apparatus shown in FIG. 25;

FIGS. 27A to 27I are signal waveforms explaining an operation of the pulse width modulation apparatus shown in FIG. 25;

FIG. 28 is a flowchart showing procedures of correcting a pulse width;

FIGS. 29A to 29K are signal waveforms illustrating output waveforms depending on set values;

FIG. 30 is a table explaining data corresponding to FIGS. 29A to 29G;

FIGS. 31A to 31H are signal waveforms illustrating output waveforms depending on set values;

FIG. 32 is a table explaining data corresponding to FIGS. 31A to 31H;

FIGS. 34A to 34D are schematic diagrams explaining output pulses corresponding to a plurality of reference positions of the pulse width modulation apparatus shown in FIG. 33;

FIGS. 35A to 35K are timing charts explaining an operation of the pulse width modulation apparatus shown in FIG. 33;

FIGS. 36A to 36E are schematic diagrams explaining an operation of the data generation circuit shown in FIG. 33;

FIG. 37 is a schematic diagram explaining shifters shown in FIG. 33;

FIGS. 39A to 39D are signal waveforms explaining the relationship between pulse modes for determining pulse generating positions and priority durations;

FIGS. 40A to 40D are signal waveforms explaining the relationship between output pulses output in respective mode and priority durations;

FIGS. 41A to 41E are signal waveforms explaining an operation when generating the output pulse PWM in low cycle;

DETAILED DESCRIPTION OF THE INVENTION

Preferred embodiments of this invention will be described with reference to the accompanying drawings:

(1) First Embodiment

Figure 1:
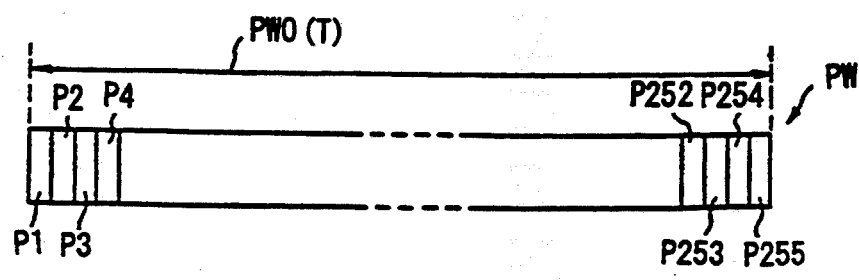
FIG. 1 is a schematic diagram explaining a unit output pulse of the pulse generation circuit of the related art for the use of a laser-beam printer.
Figure 2:
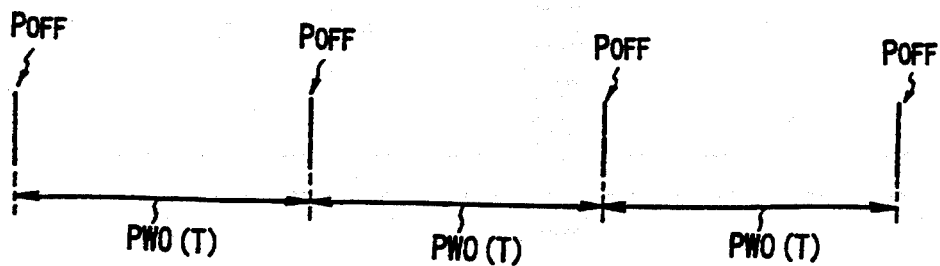
FIG. 2 is a schematic diagram explaining an offset pulse of the programmable delay circuit of the related art.
Figure 3:
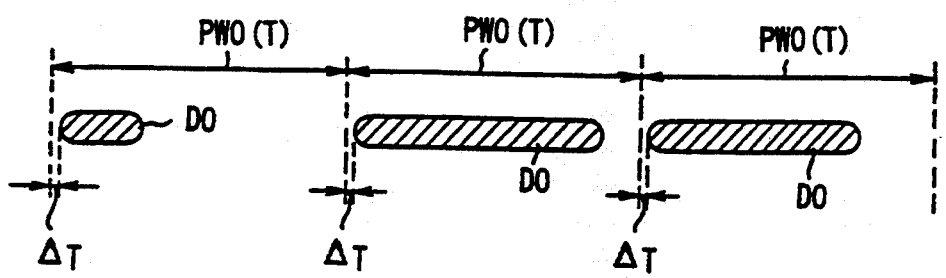
FIG. 3 is a schematic diagram explaining a blank duration of the programmable delay circuit of the related art.
Figure 4:
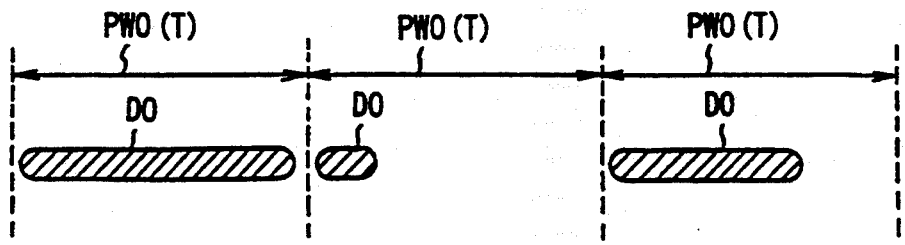
FIG. 4 is a schematic diagram explaining deteriorated tones of the laser-beam printer of the related art.
Figure 5:
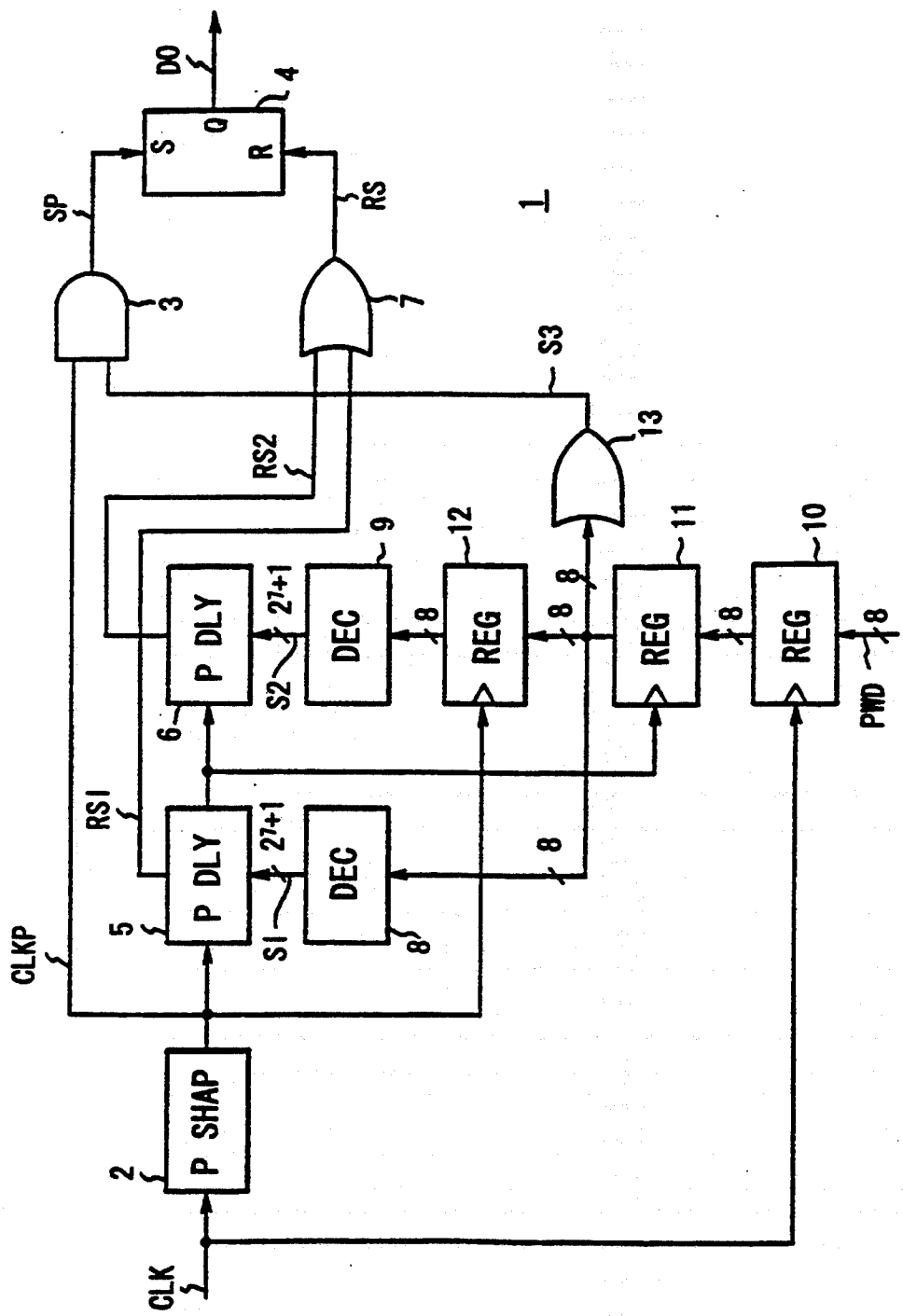
FIG. 5 is a block diagram showing the first embodiment of a pulse width modulation apparatus in this invention.

The first embodiment of this invention is shown in FIG. 5.

In FIG. 5, 1 shows a pulse width modulation apparatus as a whole. Two-stage programmable delay circuits associated with a first-half period and a second-half period of a pulse cycle T are connected in series with each other. A delay time for one of the programmable delay circuits is set while the other one thereof is in operation, thus eliminating occurrence of a blank duration or generation of an offset pulse at the start point of a pulse cycle.

To be more specific, the pulse width modulation apparatus 1 inputs a clock signal CLK of a pulse cycle T, which set a maximum output pulse width PW0 of an output pulse, to a pulse shaper 2. The pulse shaper 2 produces a clock pulse CLKP having a narrow pulse width, so that the output states of an RS (reset-set) flip-flop circuit in the later stage can be switched for a short period of time.

The pulse width modulation apparatus 1 supplies the clock pulse CLKP to the RS flip-flop circuit 4 via an AND circuit 3, whereby an output pulse DO rises the logic "H". The pulse width modulation apparatus 1 supplies a clock pulse CLKP, which has been delayed by a specified period of time, to the RS flip-flop circuit 4 via the two-stage programmable delay circuits 5 and 6, and an OR circuit 7, whereby the output pulse DO falls the logic "L".

Figure 6:
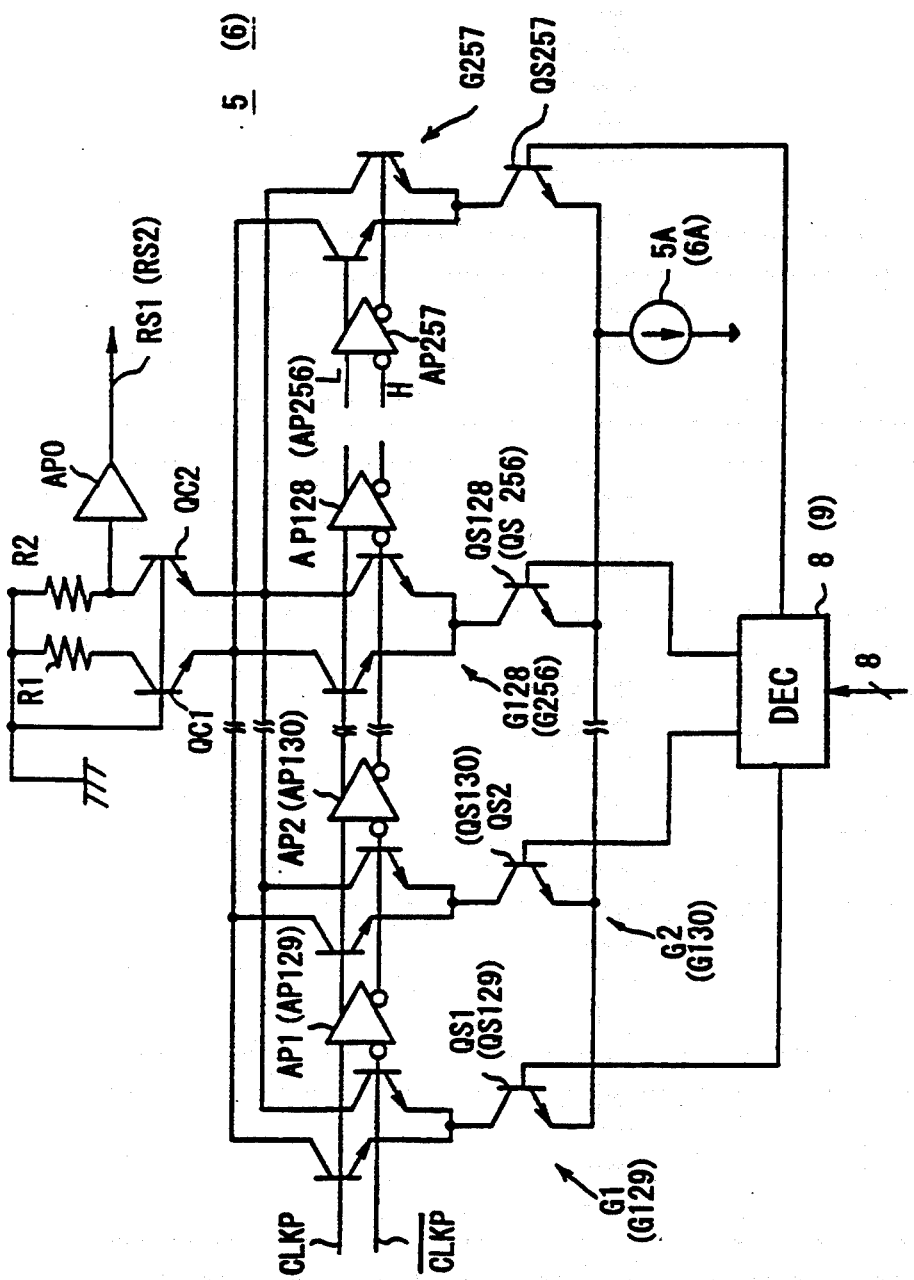
FIG. 6 is a connected diagram explaining programmable delay circuits used of the first embodiment of this invention.

As shown in FIG. 6, respective first- or second-stage programmable delay circuits 5 and 6 comprise 128 selection gates G1 to G128 and G129 to G256 for specifying a falling point of an output pulse DO, and an inhibition gate G257 for inhibiting the output of a reset pulse. Power supplies 5A and 6A are connected commonly to the emitters of selection transistors QS1 to QS257 for activating the associated gates (FIG. 6).

Each of the selection gates G1 to G256, and the inhibition gate G257 comprises a pair of differential amplifiers that are NPN transistors QNA and QNB (where, N=1 to 257). The pairs of differential amplifiers are driven via buffer amplifiers AP1 to AP256 each of which delays an input signal by a minimum unit time T0 (=T/255) and provides an output.

Load resistors R1 and R2 are connected to the collectors of the transistors serving as pairs of differential amplifiers, which constitute the selection gates G1 to G256 and the inhibition gate G257, via transistors QC1 to QC2 serving as cascade amplifiers. A clock pulse CLKP, which is delayed by the number of stages of gates preceding a gate specified in delay time setting data S1 or S2, is supplied as a reset input RS1 or RS2 to the OR circuit 7 via the load resistor R2 and a buffer amplifier AP0.

In this embodiment, the inhibition gate G257 is provided with an output potential by the differential amplifier AP128 whose non-reverse input terminal always has a potential of the logic "L". When the inhibition gate G257 is specified, the reset signal RS1 or RS2 always represents the logic "L".

The operations of changing the delay times for the programmable delay circuits 5 and 6 are controlled by decoders 8 and 9, and three-stage registers 10, 11, and 12 for temporarily holding pulse width setting data PWD that is to be input to the decoders 8 and 9.

The decoder 8 or 9 checks if the most significant bit of pulse width setting data PWD is the logic "1" or "0", and then determines whichever the reset signal RS1 or RS2 should be sent from the programmable delay circuit 5 or 6.

That is to say, the pulse width modulation apparatus 1 fetches 8-bit pulse width setting data PWD, which specifies a pulse width of an output pulse DO to be provided during the next pulse cycle according to the timing that the clock signal CLK rises, into the first-stage resistor 10. When the first-stage programmable delay circuit 5 completes processing (when the first-half cycle of an output pulse in the current pulse cycle terminates), the data value in the second-stage register 11 is updated according to the pulse width setting data PWD.

The first-stage decoder 8 then inputs the pulse width setting data PWD for the next pulse cycle, which has been newly stored in the second-stage register 11. The first-stage decoder 8 then determines whether the most-significant bit of the pulse width setting data PWD is the logic "1".

If the most-significant bit is the logic "0", the decoder 8 determines that the output pulse falls during the first-half cycle. Selection data S1 indicating that only the one of the 128 (=seventh power of 2) selection gates, which is located to provide the set delay time, be driven the logic "H" is supplied to the first-stage programmable delay circuit 5 prior to the entry of the clock pulse CLKP for the next pulse cycle.

The third-stage register 12 inputs the pulse width setting data PWD stored in the second-stage register 11, when the second-stage programmable delay circuit 6 completes processing (when the second-half cycle of the output pulse in the previous pulse cycle terminates); that is, when another clock pulse CLKP is input. The data value in the third-stage register 12 is then updated according to the pulse width setting data PWD.

Similarly, the second-stage decoder 9 reads the pulse width setting data PWD newly stored in the third register 12, and checks if the most-significant bit is the logic "1". When the most-significant bit is the logic "1", the second-stage decoder 9 determines that the output pulse falls during the second-half cycle. Before the processing for the first-half cycle is completed, selection data S2 indicating that only the one of the 128 (=seventh power of 2) selection gates located to provide a specified delay time be driven the logic "H" is calculated and supplied to the programmable delay circuit 6.

Figures 7A, 7B, 7C:
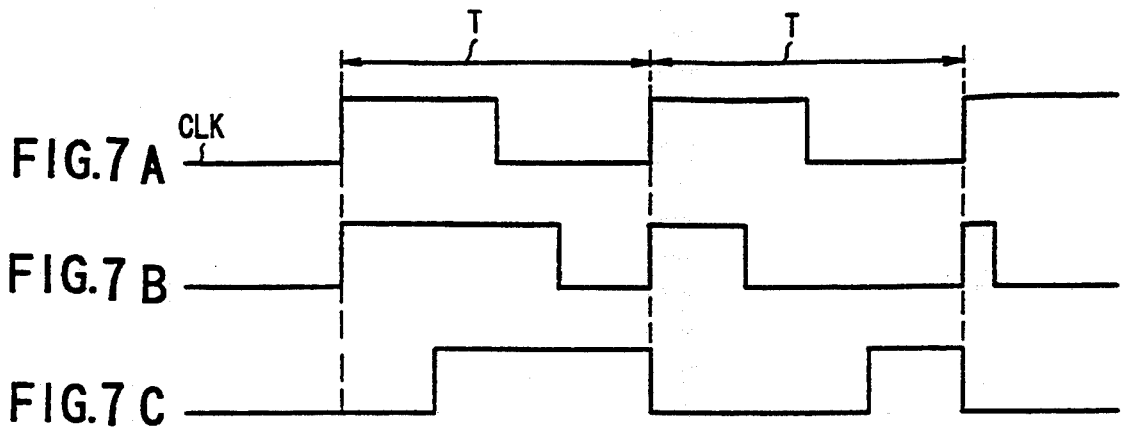
FIGS. 7A to 7C are signal waveforms showing output pulses provided by the first embodiment.

As described above, a falling point of an output pulse is specified for first-half and second-half cycles of the output pulse. More particularly, falling points for durations having a half-period deviation between them are decoded alternately. A falling point of a reset signal is thus specified in advance. A blank duration occurring at the start of an output pulse due to a delay in decoding can therefore be eliminated. All the duration of a clock cycle T can therefore be fully utilized as shown in FIGS. 7A and 7B.

The pulse width modulation apparatus 1 supplies an OR output of the 8-bit pulse width setting data PWD which is obtained by the OR circuit 13 to the AND circuit 3 that controls a set input terminal of the RS flip-flop circuit 4. The OR data and a clock pulse CLKP to be supplied after the OR data are then obtained AND.

When the pulse width setting data PWD whose 8 bits are all logic "0" (that is, "00000000") to inhibit the output of an output pulse is supplied, the pulse width modulation apparatus 1 sets the output of the AND circuit 3 to the logic "L" so that the RS flip-flop circuit 4 will not be set up. Thus, a possibility that an unnecessary output pulse rises at a start point of each pulse period is avoided effectively.

In the aforesaid constitution, the pulse width modulation apparatus 1 allows the RS flip-flop circuit 4 to provide output pulses DO having arbitrary pulse widths according to the timing chart shown in FIGS. 8A to 8M.

Specifically, the pulse width modulation apparatus 1 feeds a clock signal CLK (FIG. 8A) having a pulse cycle T to the pulse shaper 2 and first-stage register 10, changes the duty ratio of a pulse of the clock signal CLK to generate a clock pulse CLKP (FIG. 8B) having a narrow pulse width. In addition, the pulse width modulation apparatus 1 reads pulse width setting data PWD (FIG. 8C) specifying a pulse width for the next cycle and stores the read data (FIG. 8D).

In this embodiment, when the clock signal CLK rises during the first duration T1, the second-stage register 11 holds pulse width setting data PWD of the logic "00(H)" specifying a pulse width of an output pulse DO for the current period. When the clock signal CLK rises, pulse width setting data PWD of the logic "FF(H)" specifying a pulse width for the next cycle is newly stored in the first-stage register 10.

When the pulse shaper 2 outputs the clock pulse CLKP, the pulse width modulation apparatus 1 allows the third-stage register 12 to read pulse width setting data PWD of the logic "00(H)", which specifies a pulse width for the current pulse period, from the second register 11 according to the timing that the clock pulse CLKP rises (FIG. 8G).

The clock pulse CLKP for the first duration T1 is supplied to the RS flip-flop circuit 4 via the AND circuit 3. However, since the pulse width setting data PWD stored in the second-stage register 11 represents the logic "00(H)" (FIG. 8F) to inhibit the output of an output pulse, the RS flip-flop circuit 4 is not set up and a pulse width modulated output DO (FIG. 8M) is held low.

When a half of the duration T1 has elapsed, the programmable delay circuit 5 associated with the first-half cycle outputs a clock pulse CLKP (FIG. 8E), which has been delayed by a half cycle, to the programmable delay circuit 6 and second-stage register 11.

In the meantime, the second-stage register 11 reads pulse width setting data PWD (FIG. 8F) of the logic "FF(H)" from the first-stage register 10, stores the read data, and sets a permission flag S3 (FIG. 8K), which enables a clock pulse CLKP to be fed to the AND circuit 3, to the logic "H".

Meanwhile, the first-stage decoder 8 reads pulse width setting data PWD of the logic "FF(H)" which has been newly stored in the second-stage register 11.

While a clock pulse CLKP is being fed to the second-stage programmable delay circuit, the first-stage decoder 8 decodes pulse width setting data PWD of the logic "FF(H)", and outputs the result of the decoding as setting data S1 to the first-stage programmable delay circuit 5 before the next duration T2 starts.

When the next duration T2 starts with the rise of the clock signal CLK, similarly to when the first duration T1 starts, the pulse width modulation apparatus 1 updates the pulse width setting data PWD stored in the first register 10 using the data for the next cycle; that is, pulse width setting data PWD of the logic "08(H)", and then generates a clock pulse CLKP.

The pulse width modulation apparatus 1 supplies a set pulse SP (FIG. 8L) as the clock pulse CLKP to the RS flip-flop circuit 4, whereby an output pulse (FIG. 8M) rises.

The pulse width modulation apparatus 1 supplies the pulse width setting data PWD (the logic "FF(H)") (FIG. 8G) for the current cycle to the second decoder 9 that changes the output states of the second programmable delay circuit 6 which has completed the output of a clock pulse CLKP for the previous cycle, and then waits for another clock pulse CLKP to be supplied a half cycle later.

Since an output pulse having a maximum output pulse width PW0 rises, the reset signals RS1 and RS2 provided by the first-stage and second-stage programmable delay circuits 5 and 6 will not rise throughout the duration T2. An output pulse for the succeeding third duration T3 becomes a succeeding portion of the output pulse for the duration T2.

Similarly, the next duration T3 starts, and another clock pulse CLKP is input to the first-stage programmable delay circuit 5. At this time, a falling point of an output pulse for the first-half period of this duration T3 has already been specified.

The pulse width for the duration T3 is specified as the logic "08(H)" (that is, only at the 4-bit is the logic "1"). A clock pulse CLKP delayed by only 8/255 cycle is therefore output as the reset signal RS1 to the RS flip-flop circuit 4 via the OR circuit 7. Even when an output pulse must fall immediately after the start of a duration, the output pulse with fall exactly at a point specified in pulse width setting data PWD.

The pulse width modulation apparatus 1 repeats the aforesaid processing sequence for durations T4, T5, . . .

According to above constitution, a falling point of an output pulse DO is specified for each of first-half and second-half cycles constituting the pulse cycle of the output pulse DO. When specifying a falling point for one of the cycles is in progress, a series of pipeline processing is executed in advance to set a falling point for the other cycle. A blank duration required for setting a falling point is thus eliminated. Moreover, a possibility that when an output pulse rises over multiple durations, a void may occur at the start point of each duration can be nullified effectively. Consequently, the entire duration of a pulse cycle can be fully utilized.

The OR circuit 13 can detect the fall of an output pulse over the entire duration of a pulse cycle before a clock pulse CLKP enters the RS flip-flop circuit 4. A possibility that a pulsed black streak may be printed at the start of a blank duration can be avoided effectively.

A delay time for the reset signal RS1 or RS2; that is a time from when a clock pulse CLKP is input until the reset signal RS1 or RS2 is output is specified relative to the input or output of a clock pulse CLKP to or from the programmable delay circuit 5. Stable operations independent of the duty ratio of an input clock signal are thus expected.

(2) Second Embodiment

The second embodiment of this invention will be described with reference to the accompanying drawings.

Figure 9:
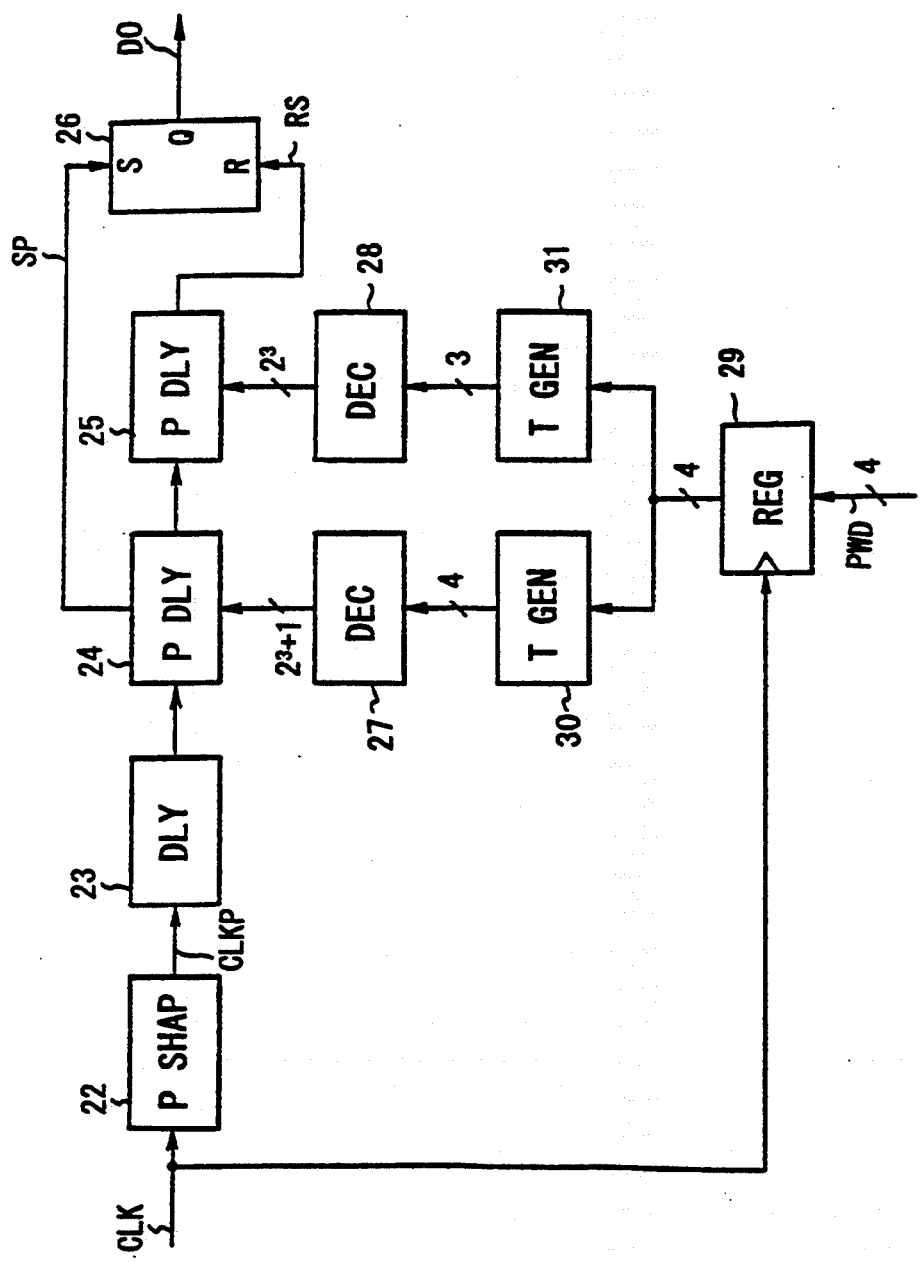
FIG. 9 is a block diagram showing the second embodiment of a pulse width modulation apparatus in this invention.

In FIG. 9, 21 denotes a pulse width modulation apparatus. Two-stage programmable delay circuits installed in association with the first-half and second-half durations of a pulse cycle are connected in series with each other. The two programmable delay circuits are used to set rising and falling points of an output pulse with the middle point of a pulse cycle. The tone of the output pulse can thus be expressed faithfully.

Thus pulse width modulation apparatus 21 supplies an input clock signal CLK of a pulse cycle T, which specifies an entire pulse width PW of an output pulse, to a pulse shaper 22. The pulse shaper 22 then produces a clock pulse CLKP having a narrow pulse width, so that the output states of an RS (reset-set) flip-flop installed in a succeeding stage can be switched for a short period of time.

The pulse width modulation apparatus 21 outputs the clock pulse CLKP to succeeding stages via a delay circuit 23, whereby time is reserved as the setting time required for a decoder to complete specifying a delay time. The delayed clock pulse CLKP is then supplied to the RS flip-flop 26 via first- and second-stage programmable delay circuits 24 and 25, whereby an output pulse rises or falls symmetrically with the middle point of a pulse cycle T.

The first-stage programmable delay circuit 24 delays a clock pulse CLKP by a half cycle and supplies the delayed clock pulse CLKP to the second-stage programmable delay circuit 25. The programmable delay circuits 24 and 25 allow a set signal SP and a reset signal RS to rise according to the timing specified in setting data.

Figure 10:
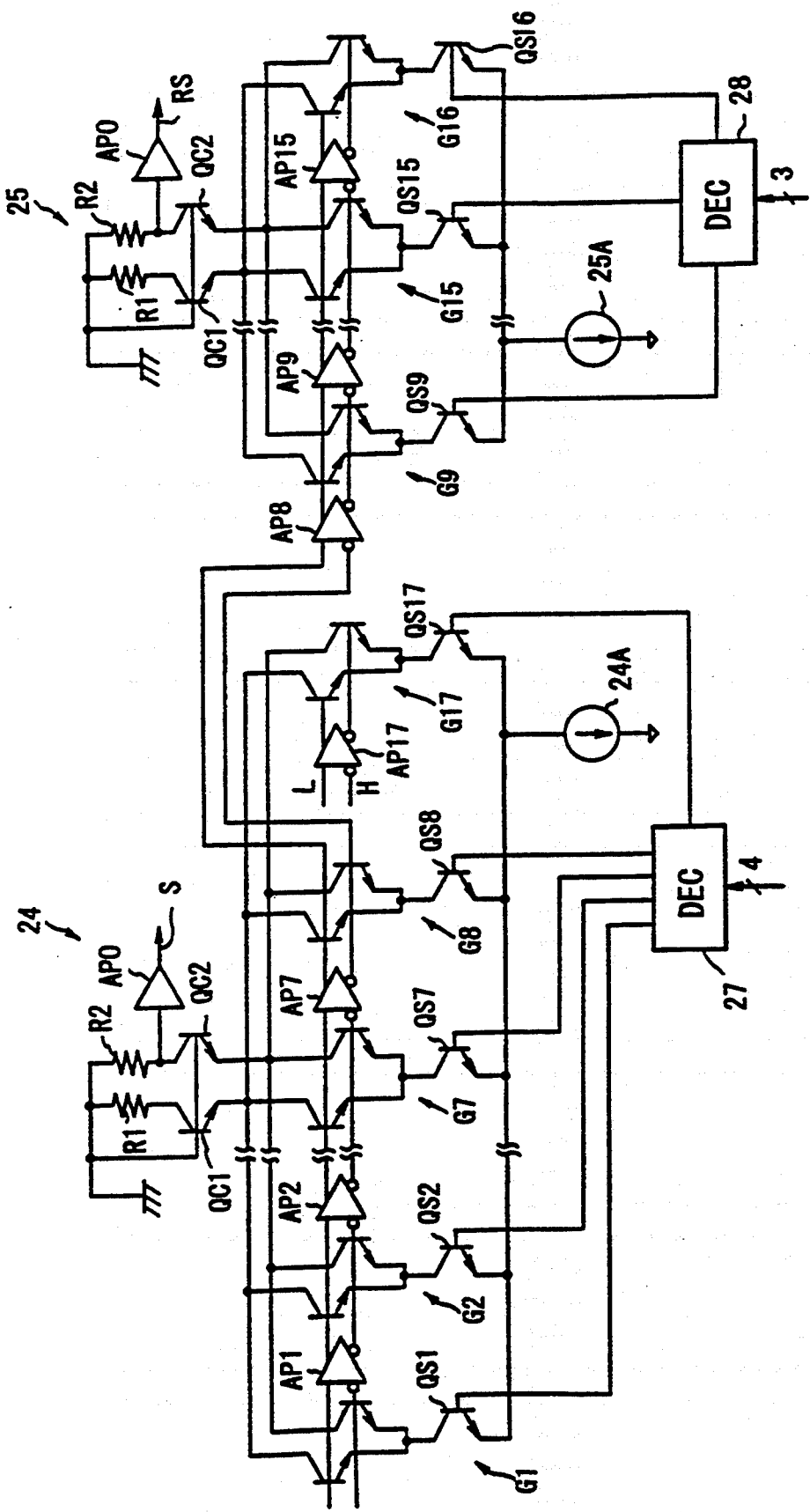
FIG. 10 is a connected diagram explaining programmable delay circuits shown in FIGS. 8A to 8M.

In this embodiment, the programmable delay circuits 24 and 25 have a configuration shown in FIG. 10.

The programmable delay circuits 24 and 25 include eight selection gates G1 to G8 and G9 to G16 for driving load resistors R1 and R2 and outputting the set signal SP and reset signal RS. The programmable delay circuit 24 further includes a rise inhibition gate G17 for inhibiting the output of a set pulse.

The selection gates G1 to G8 and G9 to G16 are connected to power supplies 24A and 25A via selection transistors QS1 to QS8 and QS9 to QS16 for activating associated gates. Only the output of a selection gate selected by the decoder is supplied via a buffer amplifier AP0.

Each of the selection gates G1 to G8 and G9 to G16 is composed of a pair of NPN transistors QNA and QNB (N=1 to 8) and QMA and QMB (M=9 to 16) serving as differential amplifiers. The NPN transistors QNA and QNB (N=1 to 8) and QMA and QMB (M=9 to 16) are connected to one another via buffer amplifiers AP1 to AP7 and AP8 to AP15 each of which delays an input signal by a certain period of time T0 (=T/16).

Transistors QC1 and QC2 serving as cascade amplifiers are connected between the selection gates G1 to G8 and G9 to G16 and load resistors R1 and R2. This circuitry helps show collector capacities smaller.

The rise inhibition gate G17 installed in the first-stage programmable delay circuit 24 is provided with an output potential by the buffer amplifier AP17 whose non-reverse input terminal always has a potential of the logic "L". When the rise inhibition gate G17 is selected, a set signal of the logic "L" is output.

The operations of changing the delay times for the programmable delay circuits 24 and 25 are controlled by two pairs of decoders 27 and 28.

The pulse width modulation apparatus 21 reads 4-bit pulse width setting data PWD in response to an input clock signal CLK, and then supplies 4- and 3-bit timing data to the decoders 27 and 28 via timing generators 30 and 31.

The first decoder 27 produces 9 (=third power of 2+1) values of setting data according to the 4-bit timing data, and supplies the data to the programmable delay circuit 24. The first decoder 27 selects a section gate according to the pulse width setting data PWD, and allows a set pulse to rise. When the pulse width setting data PWD is all-bit "0", the rise inhibition gate G17 is selected.

The second decoder 28 produces 8 (=third power of 2) values of setting data according to the 3-bit timing data, and supplies the data to the programmable delay circuit 25. The second decoder 28 selects a selection gate according to pulse width setting data PWD, and allows a reset pulse to rise.

Figure 11:
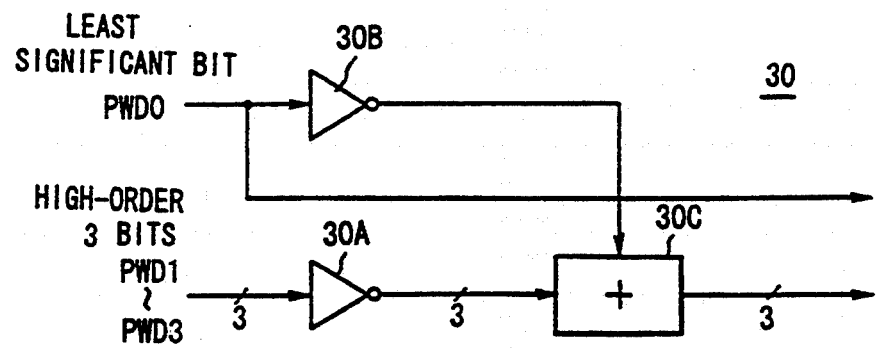
FIG. 11 is a block diagram showing a configuration of a timing generator generating signals shown in FIGS. 8A to 8M.
Figure 12:
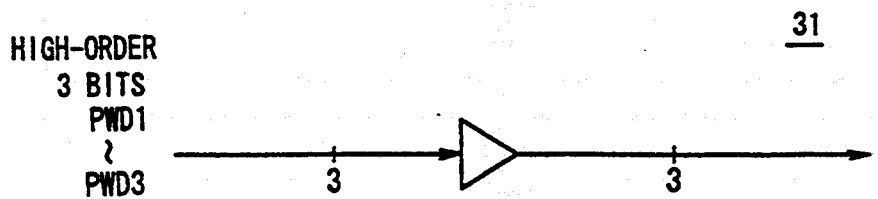
FIG. 12 is a block diagram showing a configuration of the timing generator generating signals shown in FIGS. 8A to 8M.

The first and second timing generators 30 and 31 have configurations shown in FIGS. 11 and 12.

The timing generator 30 uses an adder 30C to add a complement of three high-order bits of pulse width setting data PWD provided via an inverter 30A to a complement of a least-significant bit provided via an inverter 30B, outputs the sum to the decoder 27. The timing generator 31 outputs three high-order bits of pulse width setting data PWD to the second decoder 28 via a buffer amplifier 31A.

Thus, the adder 30C in the timing generator 30 corrects pulse width setting data PWD, when the pulse width setting data PWD represents an even number.

To be more specific, the timing generator 30 feeds the data of three high-order bits of pulse width setting data PWD to the inverter 30A, and thus provides a value corresponding to a half of a pulse width of an output pulse DO. The timing generator 30 then reverses and outputs the value, and thus provides 3-bit data representing a value PW1 calculated by subtracting a value PW2 that is a half of the pulse width of the output pulse DO from a maximum output pulse width PW0.

The timing generator 30 outputs not only the data of three high-order bits but also data of a least-significant bit at the same time. When pulse width setting data is all logic "0", no output pulse is provided.

The timing generator 31 feeds the data of three high-order bits of pulse width setting data PWD to the inverter 31A, and thus provides a value PW2 corresponding to a half of a pulse width of an output pulse DO.

In the aforesaid constitution, the pulse width modulation apparatus 21 provides an output pulses DO having arbitrary pulse widths, each of which is symmetric with respect to a middle point of a maximum output pulse width PW0, according to the timing chart shown in FIG. 14. The output pulses DO are then printed on paper.

More particularly, the pulse width modulation apparatus 21 supplies a clock signal CLK (FIG. 14A) having a pulse cycle T to the pulse shaper 2 and the register 29, and then generates a clock pulse CLKP (FIG. 14B) having a narrow pulse width by changing the duty ratio of the clock signal CLK.

The pulse width modulation apparatus 21 reads a pulse width setting data PWD (FIG. 14C) specifying a pulse width of an output pulse according to the timing that the clock signal CLK rises (FIG. 14D). In the meantime, the pulse width modulation apparatus 21 supplies a decoded value of the pulse width setting data to the programmable delay circuits 24 and 25 via the timing generators 30 and 31, and decoders 27 and 28.

The programmable delay circuit 24 inputs the clock pulse CLKP from the programmable delay circuit 23 after a setting time t1 has elapsed since the input of an input clock signal CLK (FIG. 14E), allows a set signal SP (FIG. 14F) to rise according to the timing specified by the decoder 27, and supplies the set signal SP to the RS flip-flop 26. Thus, the output pulse (FIG. 14I) rises.

When receiving a pulse (FIG. 14G), which has delayed by a half cycle since the input of the clock pulse CLKP, from the first-stage programmable delay circuit 24, the second-stage programmable delay circuit 25 allows the reset signal (FIG. 14H) to rise according to the timing specified by the decoder 28, and supplies the reset signal to the RS flip-flop 26. Thus, the output pulse (FIG. 14I) falls.

Figure 15A:
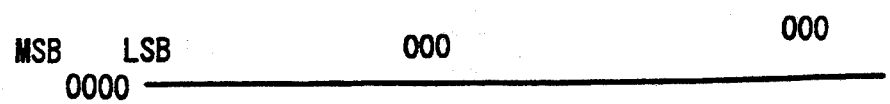
FIGS. 15A to 15F are signal waveforms explaining the relationship between a set value of a delay time and an output pulse shown in FIG. 11.

With the input of pulse width setting data PWD whose four bits are all logic "0" as shown in FIG. 15A (that is, "0000"), the timing generator 30 inputs data of "111" via the inverter 30A for handling high-order bits, and adds the logic "1", which is supplied via the inverter 30B for handling low-order bits, to the data of "111". Consequently, the timing generator 30 provides the decoder 27 with data of "0000".

The decoder 27 then selects the rise inhibition gate G17 to hold the set signal of the logic "L".

When a pulse width setting data PWD represents "0001" in that order from the most-significant bit (indicating that a pulse width is one-sixteenth of a maximum output pulse width), the timing generator 30 receives data of "111" via the inverter 30A for handling high-order bits. At this time, since the output value of the inverter 30B for handling low-order bits is the logic "0", data of "111" is supplied as a set value for the programmable delay circuit 24 to the decoder 27.

Figure 15B:
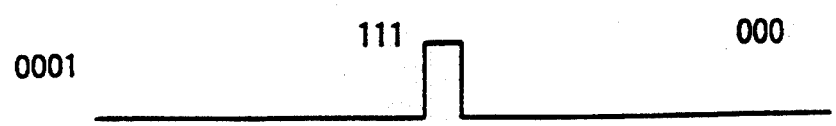

In the meantime, the other timing generator 31 receives data of three-order bits (that is data of "000") via the inverter 31A, and sets a data value for the second-stage programmable delay circuit 25. The pulse width modulation apparatus 21 then provides an output, of which pulse width is one-sixteenth of a maximum output pulse width, at a point preceding the middle point of the maximum output pulse width by an unit pulse duration (FIG. 15B).

Figure 15C:
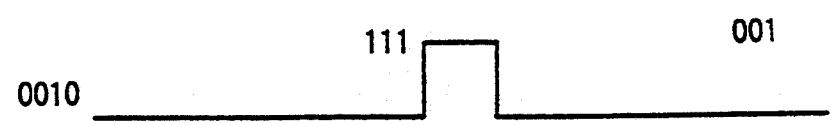
Figure 15D:
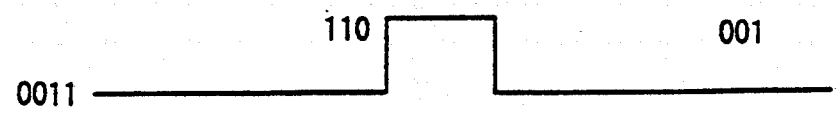
Figure 15E:
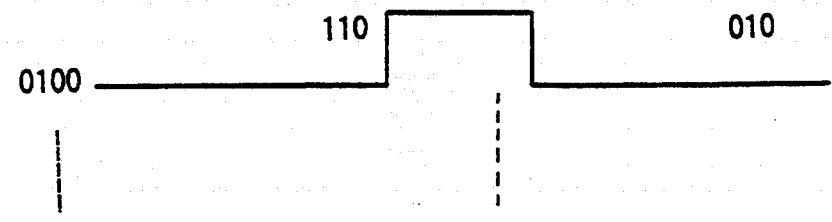
Figure 15F:
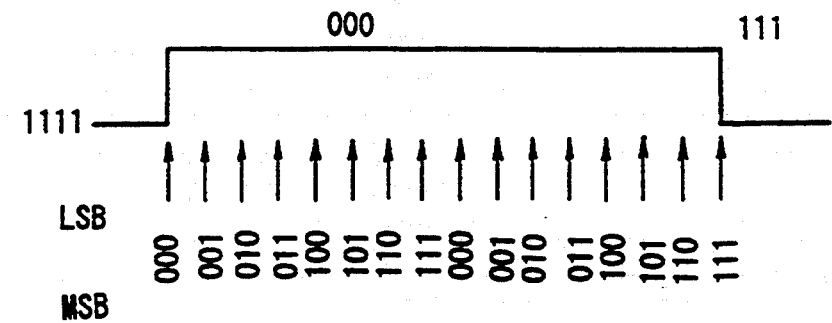

Similarly, when the pulse width setting data PWD represents "0010", "0011", "0100", . . . , and "1111" in that order from the most-significant bit (that is, when a bit width is two-sixteenths, three-sixteenths, four-sixteenths, . . . , and sixteen-sixteenths of a full pulse width), the pulse width modulation apparatus 21 provides an output pulse, which is shown in FIGS. 15C, 15D, 15E, . . . , and 15F, having a pulse width based on a half of a pulse period.

As a result, as shown in FIG. 16, even when a small-width output pulse must be supplied after an output pulse whose pulse width is close to a maximum output pulse width PW0, since a blank is created between the preceding and succeeding output pulses according to the ratio of pulse widths, a varying density (tone) of an image, which is expressed depending on a pulse width, can be regenerated accurately.

According to the above constitution, setting a rising point and a falling point of an output pulse DO is performed for each of first- and second-half cycles of a pulse cycle. A rising point for the first-half cycle is set to a point separated by a value, which is calculated by subtracting a value corresponding to a half of a pulse width of an output pulse from a value of the first-half cycle, from the start of the duration of the first-half cycle. A falling point for the second-half cycle is set to a point separated by a value, which is calculated by subtracting a value corresponding to a half of a pulse width of an output pulse from the value of the second-half cycle, from the start of the duration of the second-half cycle.

Consequently, even when a long pulse and a short pulse, which are adjacent to each other, are output consecutively to a laser-beam printer, unlike a prior art, the long and short pulses will be seen as one pulse. During printing, the tones of the pulses can be regenerated accurately.

The third embodiment of this invention will be described.

In the above first embodiment, two pairs of programmable delay circuits 5 and 6 associated with two cycles constituting a pulse cycle T are used to set a falling point. This invention is not limited to this mode. Alternatively, the pulse cycle T may be divided into n durations (n=3, 4, 5, ...). Associated with the durations, n programmable delay circuits may be connected in series.

In this case, pipeline processing is performed on n decoders associated with the programmable delay circuits using n registers and a first-stage register for storing a pulse width setting data PWD in response to an input clock signal CLK; that is, a total of n+1 registers.

The fourth embodiment of this invention will be described.

In the first embodiment, a pulse width of an output pulse DO is set with respect to the start point of a pulse cycle T. This invention is not limited to this mode. Alternatively, as shown in FIG. 7C, an end point of a pulse cycle T may be used as a reference for setting a pulse width of an output pulse DO.

In this variant, signals fed to the RS flip-flop circuit 4 should be changed. When selection data is all logic "1", reset should not be actuated.

The fifth embodiment of this invention will be described.

In the first embodiment, the programmable delay circuits 5 and 6 shown in FIG. 6 are used to delay a clock pulse CLKP. This invention is not limited to this mode. Delay circuits having other circuitries may be employed.

The sixth embodiment of this invention will be described.

In the above second embodiment, a delayed output of the first-stage programmable delay circuit 24 is used to set up the RS flip-flop circuit 26. A delayed output of the second-stage programmable delay circuit 25 is used to reset the RS flip-flop circuit 26. This invention is not limited to this mode. Alternatively, the outputs of the programmable delay circuits 24 and 25 may be switched and fed to the RS flip-flop circuit 26. The polarity of an output pulse may thus be reversed from that in the embodiment.

The seventh embodiment of this invention will be described.

In the above second embodiment, a set value of a delay time for each of buffer amplifiers AP1 to AP15 for delaying and outputting a clock pulse CLKP is represented as a fraction whose denominator is the number of bits constituting pulse width setting data. This invention is not limited to this mode. Alternatively, a delay time may be a half of the above value.

In this variant, a pulse symmetric with respect to the center of a pulse cycle can be output regardless of whether a pulse width setting data PWD represents an odd or even number.

This variant therefore obviates the adder in the timing generator, thus simplifying the circuitry.

The eighth embodiment of this invention will be described.

In the above embodiments, the programmable delay circuits 24 and 25 are used to delay a clock pulse CLKP. This invention is not limited to this mode. Alternatively, delay circuits having another circuitries may be employed.

The ninth embodiment of this invention will be described.

In the above embodiments, the pulse width of an output pulse DO is set according to 8- and 4-bit pulse width setting data PWD. This invention is not limited to this mode. The number of bits may be set freely.

The tenth embodiment of this invention will be described.

In the above embodiments, an output pulse DO provided by the RS flip-flop circuit 4 is used to drive a laser diode in a laser-beam printer. This invention is not limited to this mode, but may apply to a large variety of general pulse width modulation apparatus.

(4) Effects of Invention Regarding to First to Tenth Embodiments

As described above, according to this invention, a pulse cycle is divided into multiple delay output stages. A rising or falling to be latched by the latch means is controlled according to the delayed control pulse provided in each of the delay output means associated with the stages. Before a control pulse enters each delay output means, a delay time for each delay output means can be specified. An output pulse having an arbitrary pulse width with respect to an arbitrary point can therefore be output without generating an offset pulse or a blank duration at the start of each pulse duration.

First and second pulse point change data specified by the first and second pulse point setting means are supplied to the first and second decoder means. Delay times specified in the first and second pulse point change data are supplied to the first- and second-stage delay output means associated with first- and second-half cycles of a pulse cycle. An output pulse provided by the latch means is thus rearranged to be substantially symmetric with respect to the middle point of a pulse cycle. It is therefore effectively avoided that an output pulse having a large pulse width and a succeeding output pulse having a small pulse width are seen united to eventually deteriorate the tones of the pulses.

(5) Eleventh Embodiment

Figure 17:
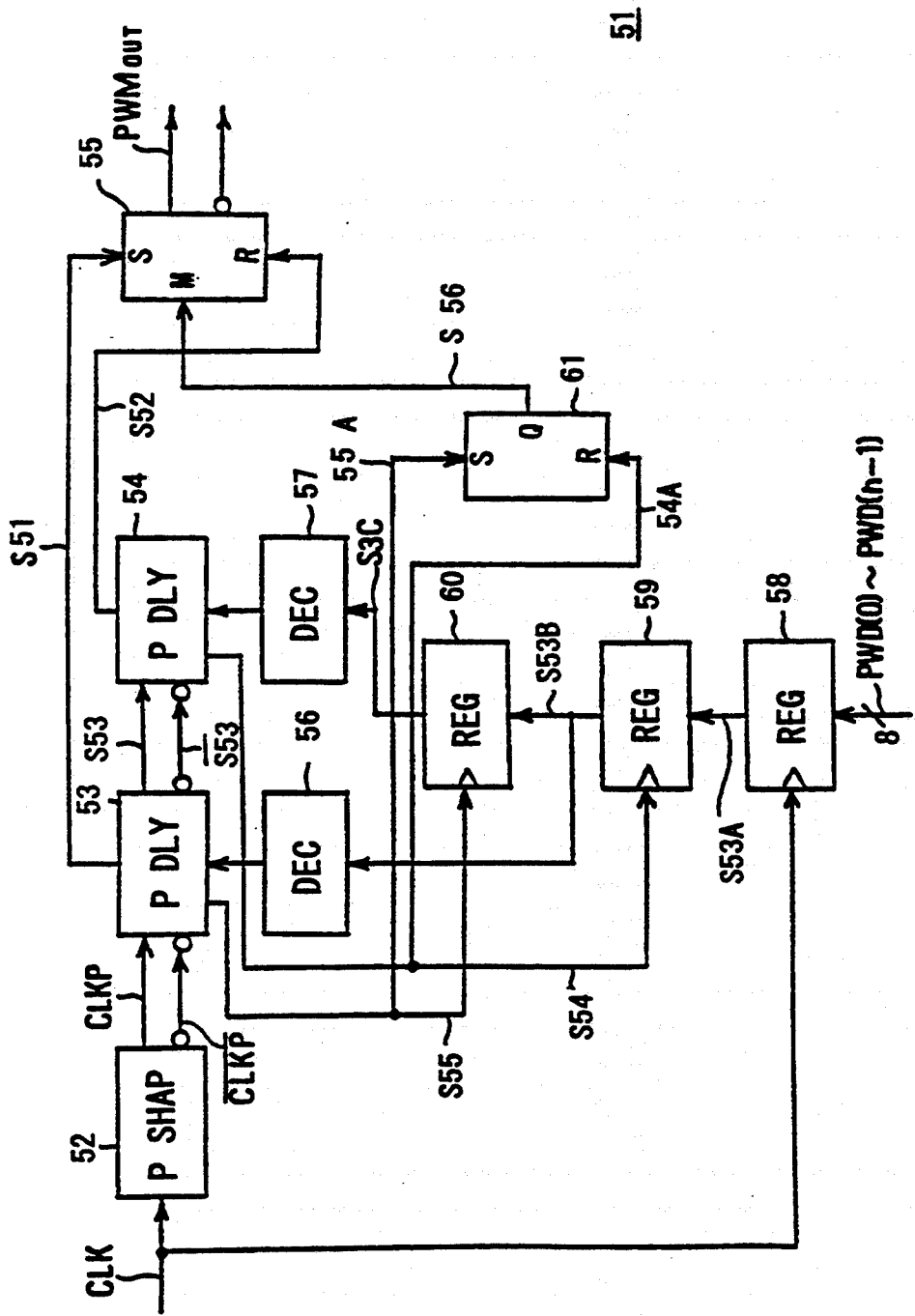
FIG. 17 is a block diagram showing the eleventh embodiment of the other pulse width modulation apparatus of this invention.

The eleventh embodiment of this invention is shown in FIG. 17.

In FIG. 17, 51 generally denotes a pulse width modulation apparatus in which two stages of programmable delay circuits are connected in series corresponding to first and second halves of a pulse cycle T. While one of the programmable delay circuits is operating, a delay time of the other programmable delay circuit is set.

In the pulse width modulation apparatus 51, a clock signal CLK having a duty ratio of 50[%] in its period corresponding to a pulse cycle T of an output pulse is converted into a clock pulse CLKP of narrower pulse width through a pulse shaper 52 from which the clock pulse CLKP is applied to programmable delay circuits 53 and 54 connected in series.

The programmable delay circuits 53 and 54 respectively comprise plural steps of delay gates connected in series for delaying and outputting the clock pulse CLKP output from the pulse shaper 52 in units of a predetermined time, and select gates associated respectively with the delay gates and connected in series. The programmable delay circuits 53 and 54 output a set pulse S51 and a reset pulse S52 to an RS-FF circuit 55 at respective timings set by pulse width setting data PWD.

Delay times of the programmable delay circuits 53 and 54 are respectively controlled by two decoders 56 and 57. The decoders 56 and 57 take in the pulse width setting data PWD from registers 59 and 60 at respective timings shifted from each other by a half cycle.

Such take-in of the pulse width setting data PWD is carried out in the following timed relationship. First, at the rising timing of the clock signal CLK, the pulse width modulation circuit 51 takes in and holds the pulse width setting data PWD (FIG. 18B) for a next pulse cycle in a first-stage register 58. Then, when a read enable signal S54 (FIG. 18F) is output from the latter-stage programmable delay circuit 54, the second-stage register 59 take in, from the first-stage register 58, the pulse width setting data PWD, which is to be output to the decoder 56 corresponding to the first-half cycle currently being at rest, for updating of the data (FIG. 18G).

Here, since the read enable pulse S54 is set to be output from the position at several steps counting from the head of the delay gates making up the programmable delay circuit 54, the decoder 56 can completely decode the pulse width setting data PWD until the clock pulse CLKP has reached the final step of the programmable delay circuit 54, and also can set from which step of the delay gates an output is to be selected, before the clock pulse CLKP corresponding to the next pulse cycle T is applied to the programmable delay circuit 53.

Figure 18:
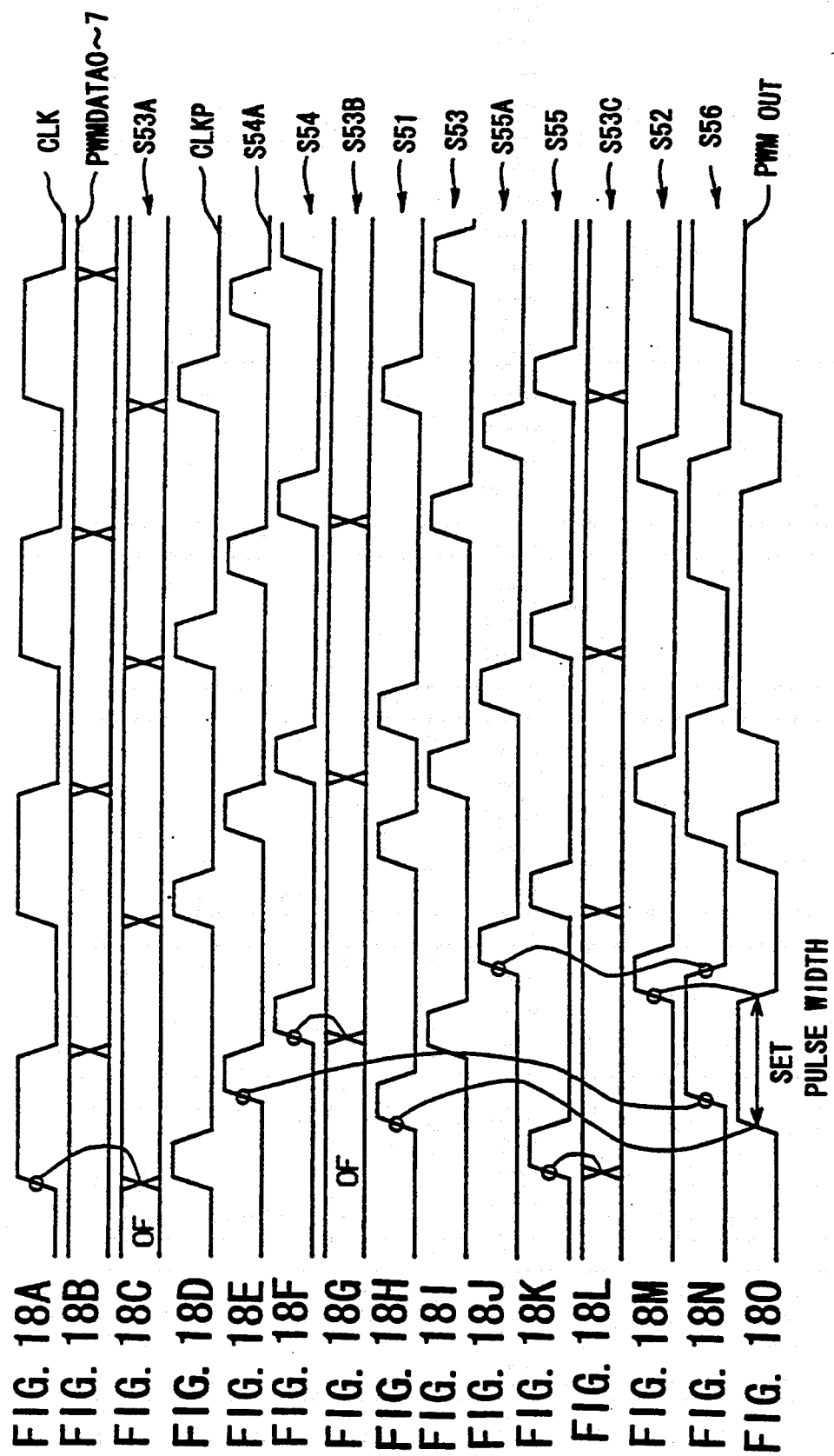
FIGS. 18A to 18O are signal waveforms explaining an operation of the pulse width modulation apparatus shown in FIG. 17.

Then, when the clock pulse CLKP of the next pulse cycle T passes the position at several steps counting from the head of the delay gates making up the programmable delay circuit 53 and a read enable signal S55 (FIG. 18K) is output from the circuit 53, the third-stage register 60 takes in, from the second-stage register 59, the pulse width setting data PWD, which is to be output to the decoder 57 corresponding to the second-half cycle currently being at rest, for updating of the data (FIG. 18L).

Similarly to the above process described in connection with the decoder 56, the decoder 57 can completely decode the pulse width setting data PWD until the clock pulse CLKP has reached the final step of the programmable delay circuit 53, and also can set from which step of the delay gates an output is to be selected, before that clock pulse CLKP is applied to the programmable delay circuit 54.

By thus setting the rising position and the falling position of the output pulse in a divided manner corresponding to the first-half and second-half cycles of the output pulse so that while one of the programmable delay circuits is operating, a delay time of the other front-stage programmable delay circuit is set. It is possible to eliminate the blank duration due to a lag in the decoding even at the beginning of the output pulse, and effectively utilize the entire span of the clock cycle T.

Furthermore, in order that the output pulse having a desired waveform is delivered even if the set pulse S51 and S52 respectively output from the programmable delay circuits 53 and 54 both take the logic "H" level, the pulse width modulation apparatus 51 is arranged to have priority in the set input and the reset input applied to the RS-FF circuit 55, so that the priority is able to change over depending on the pulse width of the output pulse.

The above priority is controlled to change over by a mode switching signal S56 (FIG. 18N) output from a mode switching RS-FF circuit 61.

The mode switching RS-FF circuit 61 is arranged such that mode switching signals S54A (FIG. 18E) and 55A (FIG. 18J) are respectively applied to a reset input terminal and a set input terminal thereof from nearly central positions of the respective groups of delay gates making up the programmable delay circuits 53 and 54 corresponding to the first and second halves of the pulse cycle T.

When the mode switching signal S56 from the mode switching RS-FF circuit 61 is at the logic "H" level, the priority function of the RS-FF circuit 55 is switched over to set a reset pulse priority mode. On the other hand, when the mode switching signal S56 is at the logic "L" level, the priority function of the RS-FF circuit 55 is switched over to set a set pulse priority mode.

Specifically, the mode switching signal S56 applied to the RS-FF circuit 55 is set to the logic "H" level for the duration of the pulse cycle between a quarter cycles (T/4) and three-quarters cycle (3T/4), and to the logic "L" level for the duration of the pulse cycle between the three-quarters cycle (3T/4) and a quarter cycle (T/4) in the next cycle.

(6) Twelfth to Nineteenth Embodiments

Configuration of RS-FF circuit with priority select function which is the twelfth embodiment of this invention will be described.

Figure 19:
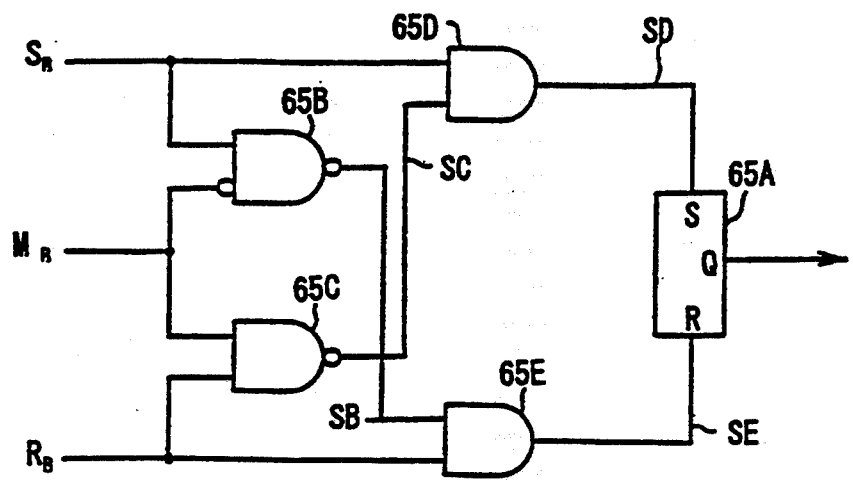
FIG. 19 is a block diagram illustrating the circuit configuration of an RS-FF circuit with a priority select function shown in FIG. 17.

The RS-FF circuit 55 having a priority select function can be realized with the circuit configuration shown in a block diagram of FIG. 19.

The RS-FF circuit 55 with a priority select function comprises an RS-FF circuit 65A and gate stages 65B to 65E upstream of the RS-FF circuit 65A, which cooperate to essentially narrow the pulse width of lower-priority one of the set pulse S and the reset pulse R applied from the programmable delay circuits 53 and 54.

Figure 20:
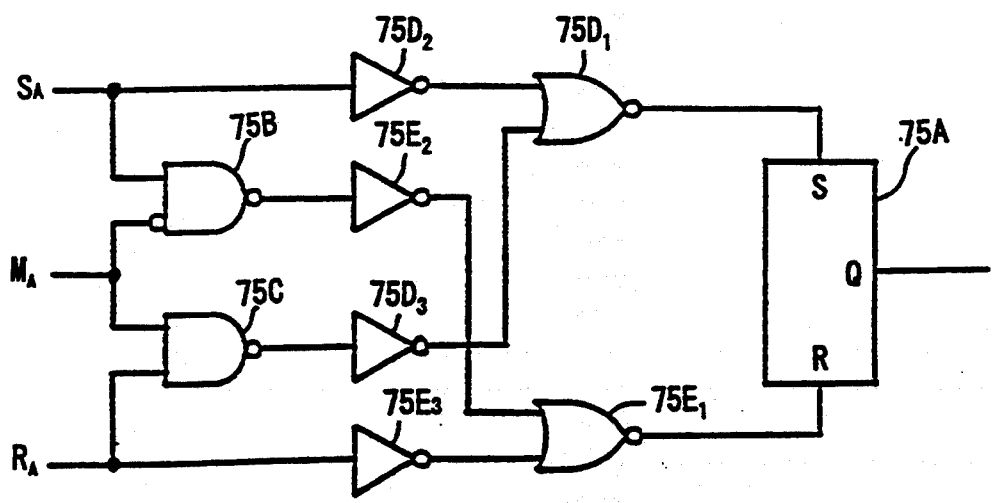
FIG. 20 is a block diagram illustrating an equivalent circuit of the RS-FF circuit shown in FIG. 17.

The thirteenth embodiment will be described. As shown in FIG. 20, the RS-FF circuit 55 with a priority select function shown in FIG. 19 is equivalently changed into the circuit configuration by replacing an AND gate 65E with inverters 75E$_2$, 75E$_3$ and a NOR circuit 75E$_1$ and also an AND gate 65D with inverters 75D$_2$, 75D$_3$ and a NOR circuit 75D$_1$.

Figure 21:
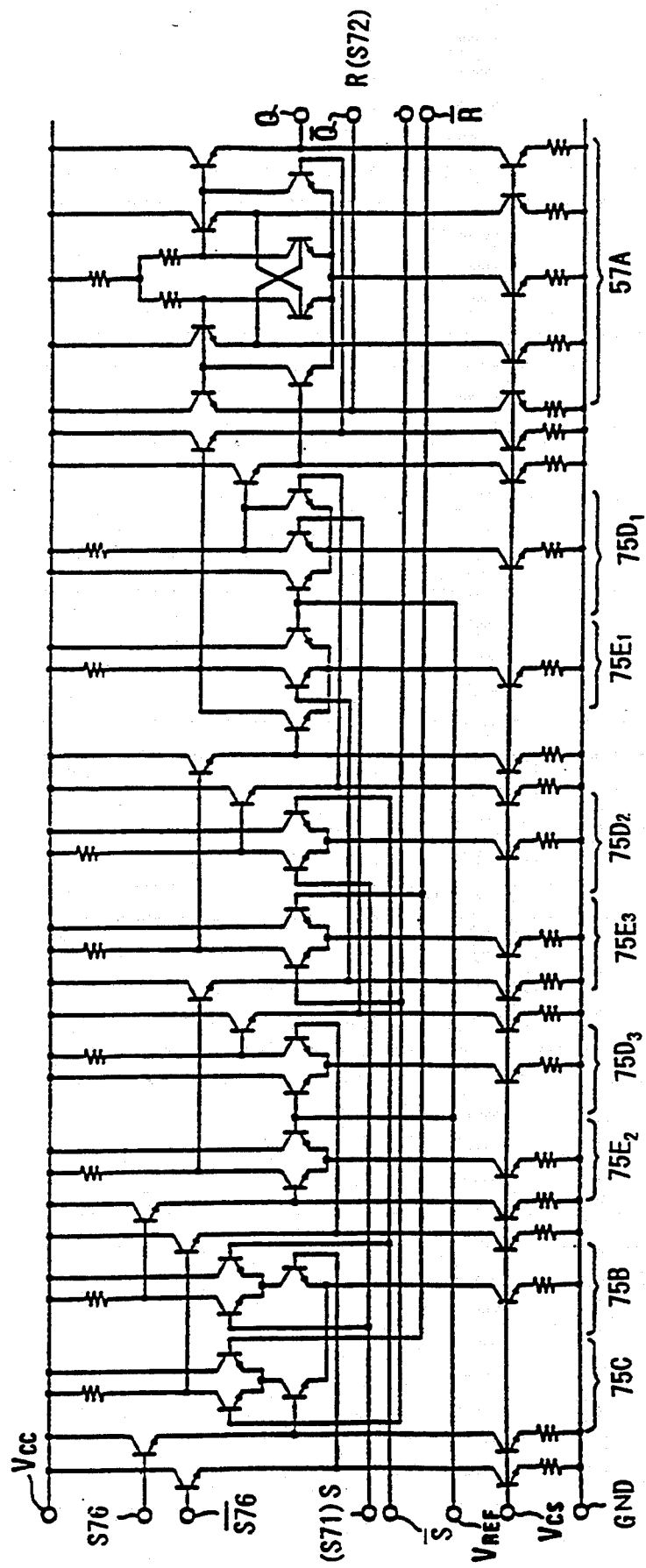
FIG. 21 is a connected diagram illustrating an equivalent circuit of the RS-FF circuit shown in FIG. 20.

Additionally, the circuit configuration of FIG. 20 can be realized by a circuit diagram of FIG. 21, for example, which represents each of the gates in the form of transistors, resistors, as well as connections therebetween.

The RS-FF circuit 55 with a priority select function operates as shown in FIGS. 22A to 22H. In the case of generating a narrow output pulse near the center of the pulse cycle, for example, since a mode selection signal M is at the logic "H" level (in the duration where the reset pulse R rises immediately after rising of the set pulse S), a Gate output SB (FIG. 22E) of a NAND Gate 65B which dominates the rising of the reset input is forcibly set to the logic "H" level.

On the other hand, during the subsequent duration in which the reset pulse R remains raised, a gate output SC (FIG. 22D) of a NAND Gate 65C which dominates the rising of the set input is forcibly fallen to the logic "L" level.

Figure 22A:
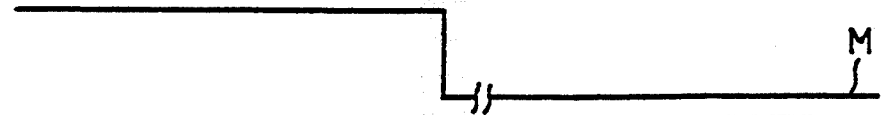
FIGS. 22A to 22H are signal waveforms explaining an operation of the RS-FF circuit shown in the block diagram of FIG. 20.
Figure 22B:
Figure 22C:
Figure 22D:
Figure 22E:
Figure 22F:
Figure 22G:
Figure 22H:

Accordingly, the set input Given by the logical product of the set pulse S and the Gate output SC can be fallen in synchronization with the rising of the reset pulse R (FIG. 22E). Also, the reset input given by the logical product of the reset pulse R and the gate output SB can be raised in synchronization with the rising of the reset pulse R (FIG. 22G).

Conversely, in the case of generating an output pulse slightly shorter than the pulse cycle, since the mode selection signal M is the logic "L" level (in the duration where the set pulse S rises immediately after the rising of the reset pulse R), the gate output SC (FIG. 22D) of the NAND Gate 65C which dominates the rising of the set input is forcibly set to the logic "H" level.

On the other hand, during the subsequent duration in which the set pulse S remains raised, the gate output SB (FIG. 22E) of the NAND gate 65B which dominates the rising of the reset input is forcibly fallen to the logic "L" level.

Accordingly, the set input given by the logical product of the set pulse S and the gate output SC can be raised in synchronization with the rising of the set pulse R. Also, the reset input given by the logical product of the reset pulse R and the gate output SB can be fallen in synchronization with the rising of the reset pulse R.

Operation of the pulse width modulation apparatus 51 shown in FIG. 17 thus arranged will be described separately in connection with the case where the pulse width set by the pulse width setting data PWD is very narrow, and the case where two output pulses are produced successively with a small gap therebetween.

A description will first be given of the case of generating the output pulse, which has a width corresponding to one step of delay gates, nearly at the central position of the clock cycle T. In the pulse width modulation apparatus 51, the pulse width setting data PWD is taken and decoded in the decoders 56 and 57 at the respective predetermined timings to be ready for input of the clock pulses CLKP to the programmable delay circuits 53 and 54.

For example, the decoder 56 selects an output of the second step counting from the end of the first group of delay gates making up the programmable delay circuit 53 for outputting the set pulse S51, while the decoder 57 directly outputs, as the reset signal S52, the clock pulse CLKP applied to the programmable delay circuit 54 (FIGS. 23B and 23C).

Therefore, while the set pulse S51 remains raised at the logic "H" level, the reset pulse S52 is also raised to the logic "H" level. This would bring the RS-FF circuit 55 into an un-steady condition in a partial overlap span as indicated in FIG. 23D, if the priority function is absent from the RS-FF circuit 55.

In this embodiment, however, the RS-FF circuit 55 is provided with the priority select function such that the mode switching signal S56 (FIG. 22A) is raised to the logic "H" level in the above overlap zone for giving the reset pulse S52 with priority. Accordingly, the output pulse $PWM_{OUT}$ can be fallen to the logic "L" level at the same time as the rising of the reset pulse S52.

On the contrary, in the case of raising two output pulses successively with a small gap therebetween, the set pulse S51 is raised after the rising of the reset pulse S52 with a time difference, for example, corresponding one step of delay gates.

Therefore, while the reset pulse S52 remains raised at the logic "H" level, the set pulse S51 is also raised to the logic "H" level. This would bring the RS-FF circuit 55 into an un-steady condition in a partial overlap span as indicated in FIG. 24D, if the priority function is absent from the RS-FF circuit 55.

However, the mode switching signal S56 (FIG. 22A) is fallen to the logic "L" level in the above overlap zone for giving the set pulse S51 with priority. Accordingly, the output pulse $PWM_{OUT}$ can be raised to the logic "H" level at the same time as the rising of the set pulse S51.

Thus, in the pulse width modulation apparatus 51 of this embodiment, the priority is changed over such that regardless of whether the reset pulse S52 rises subsequent to the set pulse S51 or the set pulse S51 rises subsequent to the reset pulse S52, priority is given to the pulse rising later. As a result, in any case, the output pulse PWM having a width as set by the pulse width setting data PWD can be produced.

With the above configuration, in the pulse width modulation apparatus 51 for generating an output pulse to be substantially symmetrical about the center of the pulse width, by setting the priority of the set pulse S51 and the reset pulse S52 used to control the RS-FF circuit 55 and changing over the priority depending on whether the pulse rises near the center of the pulse cycle or in other duration, the output pulse which has been raised by the set pulse S51 can be fallen by the reset pulse S52 even immediately after the rising of the set pulse S51, and also the output pulse which has been fallen by the reset pulse S52 can be raised by the set pulse S51 even immediately after the falling of the reset pulse S52.

Further, the provision of the priority select function in the RS-FF circuit 55 can eliminate the need of a circuit for correcting the boundary region between adjacent pulse cycles which has been required in raising or falling the output pulse for the entire pulse cycle, thereby reducing the number of devices used remarkably.

The fourteenth embodiment of this invention will be described.

In the above twelfth embodiment, the description has been made as dividing the pulse cycle T into two first and second halves, and controlling rising or falling of the output pulse in each half. However, this invention is not limited thereto and may be modified so as not to divide the pulse cycle into parts, or to divide the pulse cycle into three or more spans and control rising or falling of the output pulse by plural stages of programmable delay circuits connected in series corresponding to the respective durations.

The fifteenth embodiment of this invention will be described.

Also, in the above fourteenth embodiment, the description has been made with reference to the case where the clock signal CLK is converted into the clock pulse CLKP of narrow pulse width by using the pulse shaper 52 so that the set pulse S51 and the reset pulse S52 both applied to the RS-FF circuit 55 will not overlap with each other. However, this invention is not limited thereto and the similar advantage can also be obtained without using the pulse shaper 52. In this case, power consumption can be cut down and the number of devices used can be reduced remarkably.

The sixteenth embodiment of this invention will be described.

Further, in the above fifteenth embodiment, the description has been made as setting the RS-FF circuit 55 by the front-stage programmable delay circuit 53 and resetting the RS-FF circuit 55 by the latter-stage programmable delay circuit 54. However, this invention is not limited thereto and may be modified so as to reset the RS-FF circuit 55 by the programmable delay circuit 53 and set the RS-FF circuit 55 by the latter-stage programmable delay circuit 54. In this case, the output pulse can be reversed in its polarity, i.e., positive and negative levels, with respect to the above embodiment.

The seventeenth embodiment of this invention will be described.

While the above sixteenth embodiment has been described in connection with the case where the RS-FF circuit 55 with a priority select function is constituted as shown in FIGS. 19 to 21, this invention is not limited thereto and may be applied to other circuit configurations.

The eighteenth embodiment of this invention will be described.

Furthermore, the above embodiment has been described in connection with the case where the operation mode of the RS-FF circuit 55 is changed over by the mode switching signal S56 nearly at the centers of the respective spans corresponding to the programmable delay circuits 53 and 54. However, this invention is not limited thereto and the operation mode may be changed in any duration except for the duration in which the set pulse S51 and the reset pulse S52 may rise simultaneously (i.e., the span corresponding to the time through which the clock pulse CLKP is delayed by the first and final steps of each group of delay gates defining the boundary between the two programmable delay circuits).

The nineteenth embodiment of this invention will be described.

Additionally, while the above embodiment has been described in connection with the case where a laser diode of laser beam printers is driven by the output pulse delivered from the pulse width modulation apparatus 51, this invention is not limited thereto and may also be applied to other various electronic equipment such as digital copying machines.

(7) Effects of Invention Regarding to Twelfth to Nineteenth Embodiments

According to this invention, as described above, by providing a set pulse priority mode and a reset pulse priority mode in latch means for delivering an output pulse with an arbitrary pulse width, and changing over these two modes depending on a predetermined span of a certain period equal to the cycle of a control pulse applied to delay means, there can be easily obtained a pulse width modulation apparatus in which even if control pulses for controlling the latch means are applied to a set input terminal and a reset input terminal of the latch means almost at the same timing, a higher-priority input terminal is surely given with priority, making it possible to avoid a fear that the latch means may come into an unsteady condition, and deliver the output pulse having a waveform with high fidelity to the set data.

(8) Twentieth Embodiment

The Twentieth embodiment of this invention will be described with accompanying drawings.

Figure 25:
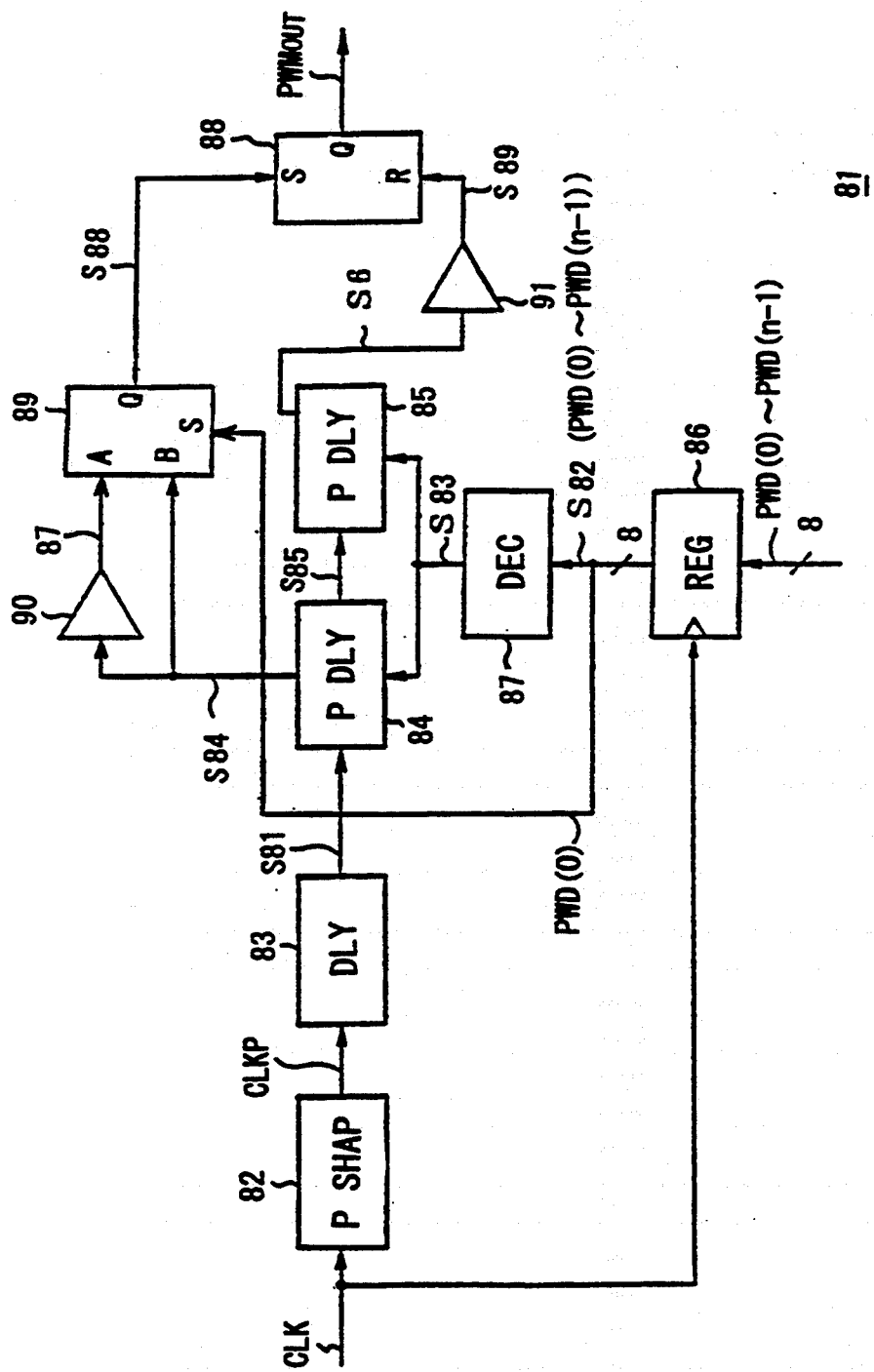
FIG. 25 is a block diagram showing the twentieth embodiment of a pulse width modulation apparatus of this invention.

In FIG. 25, 81 generally denotes a pulse width modulation apparatus in which two stages of programmable delay circuits are connected in series corresponding to two first and second halves of a pulse cycle T. The front-stage programmable delay circuit raises an output pulse $PWM_{OUT}$ (with a delay time TA), and the latter-stage programmable delay circuit falls the output pulse $PWM_{OUT}$ (with a delay time TB).

The delay time TB for setting the position where the output pulse $PWM_{OUT}$ falls is almost coincident with a time TC resulted by subtracting the delay time TA for setting the time position from a half cycle (=T/2) of the pulse cycle T, so that the output pulse $PWM_{OUT}$ is generated which has a waveform almost symmetrical about the center of the half period of the pulse cycle T (FIGS. 26A and 26B).

The detailed configuration of the pulse width modulation apparatus 81 will be described below in order. In the pulse width modulation apparatus 81, a clock signal CLK (FIG. 27A) with its cycle T corresponding to a maximum output pulse width PW0 of the output pulse $PWM_{OUT}$ is converted into a clock pulse CLKP (FIG. 27B) of narrower pulse width through a pulse shaper 82 from which the clock pulse CLKP is output.

A delay circuit 83 receives the clock pulse CLKP, delays it through a predetermined time, and then outputs the same as a delayed clock pulse S81 to the two stages of programmable delay circuits 84 and 85 (FIG. 27E).

On the other hand, at the rising timing of the clock signal CLK, a register 86 takes in and holds pulse width setting data PWD(0) to PWD(n−1) (FIG. 27C).

A decoder 87 receives the pulse width setting data PWD(0) to PWD(n−1) held in the register 86, as a register output S82 (FIG. 27D), and decodes the data. After decoded data has been established, the decoder 87 outputs the decoded data, as a select signal S83, to the programmable delay circuits 84 and 85.

It is to be noted that the time during which the output data of the decoder 87 is established (i.e., the setting time) corresponds to a delay time T of the delay circuit 83.

For example, when the programmable delay circuits 84 and 85 comprise eight steps of delay gates G1 to G8 and seven steps of delay gates G9 to G15, respectively, which are connected in series, each delay gate delays the delayed clock pulse S81 in units of 1 step (=T/15).

The programmable delay circuit 84 corresponding to the first half of the pulse cycle T delays the delayed clock pulse S81 through steps of the delay gates in the number selected by the select signal S83, and outputs it as a set pulse S84 for thereby setting the rise timing of the output pulse $PWM_{OUT}$.

On the other hand, the programmable delay circuit 85 corresponding to the second half of the pulse cycle T delays a delayed output S85, which has been delayed by the programmable delay circuit 84, through steps of the delay gates in the number selected, and outputs it as a reset pulse S86 for thereby setting the fall timing of the output pulse $PWM_{OUT}$.

While the output pulse $PWM_{OUT}$ is thus generated in accordance with the set pulse S84 and the reset pulse S86, the timing of outputting the set pulse S84 is controlled by using a selector 89 comprising a multiplexer and a delay gate 90 in this embodiment for obtaining an output waveform symmetrical about the center of the pulse cycle T.

The selector 89 receives the least significant bit PWD(0) of the pulse width setting data PWD(0) to PWD(n−1). An input terminal of the selector 89 is switched over depending on whether a value of the least significant bit PWD(0) is the logic "0" or not, whereby the output timing of the set pulse S84 is adjusted by a unit pulse delay time (FIG. 28).

As shown in FIG. 28, the selector 89 determines in a step SP2 whether the least significant bit PWD(0) is the logic "0" or not. If the decision is affirmative (i.e., if whether the least significant bit PWD(0) is the logic "0"), then the set pulse S84 is delayed by the delay gate 90 through one step and output as a set signal S88. If the decision is negative (i.e., if whether the least significant bit PWD(0) is the logic "1"), then the set pulse S84 is directly output as a set signal S88 (FIG. 27F).

Meanwhile, a delay gate 91 serves to delay the reset pulse S86, applied to a reset terminal of an RS-FF circuit 88, through a time corresponding to the delay time by the selector 89, and then output a reset signal S89 (FIG. 27H).

Incidentally, the reset/set flip-flop circuit 88 (hereinafter referred to as the RS-FF circuit 88) includes a priority change-over function (not shown).

With such a priority change-over function, even if the set signal S88 and the reset signal S89 rise to the logic "H" level at the same time, the priority is given to the reset signal S89 near the center of the pulse cycle, and to the set signal S88 near both ends of the pulse cycle.

As a result, the output pulse $PWM_{OUT}$ delivered from the RS-FF circuit 88 has a waveform almost laterally symmetrical about the center of the pulse cycle T.

Assuming that the 4-bit pulse width setting data PWD(0) to PWD(n−1) is applied to the pulse width modulation apparatus 81 in the above configuration, the relationship of the set pulse S84 and the reset pulse S86 output from the programmable delay circuits 84 and 85 with respect to the set signals S88 and S89 actually input to the RS-FF circuit 88 will now be described separately in connection with the case where the pulse width specified by the pulse width setting data PWD is even-number times the unit delay time and the case where it is odd-number times the unit delay time.

First, a description will be given of the case where the pulse width specified by the pulse width setting data PWD is even-number times the unit delay time.

When the pulse width of the output pulse $PWM_{OUT}$ is the logic "0", for example, the pulse width setting data PWD(0) to PWD(n−1) is the set value "0000" and the set value of the select signal S83 output from the decoder 87 is the set value "000" (see FIG. 30).

Terminals of the delay gates in the programmable delay circuits 84 and 85 selected by the set value "000" of the select signal S83 correspond to the input terminal and the output terminal of the delay gate G8, respectively. Therefore, a time difference corresponding to one step of the delay gates produces between the set pulse S84 (indicated by a broken line in FIG. 29C) and the reset signal S89 (FIG. 29D) respectively output from the programmable delay circuits 84 and 85.

However, the input terminal of the selector 89 is changed over to the side of the delay gate 90 in response to the logic "0" of the least significant bit PWD(0). Accordingly, the set signal S88 actually applied to a set input terminal S of the RS-FF circuit 88 is delayed through one step of the delay gates so that the set signal S88 and the reset signal S89 are coincident in rising timing with each other as indicated by solid lines in FIG. 29C.

At this time, since the operation mode of the RS-FF circuit 88 gives reset with priority, the output pulse $PWM_{OUT}$ delivered from an output terminal Q remains at the logic "L" level an and hence no output is issued.

Then, in the case where the pulse width set by the pulse width setting data PWD is "2" (FIG. 31E), etc. and finally in the case where the pulse width is "14" (FIG. 31F), the output pulse $PWM_{OUT}$ symmetrical about the center of the pulse cycle T is also delivered by the similar processing operation.

Next, a description will be given of the case where the pulse width set by the pulse width setting data PWD is odd-number times the unit delay times.

When the pulse width of the output pulse $PWM_{OUT}$ is "1", for example, the pulse width setting data PWD(0) to PWD(n−1) is "0001" and the set value of the select signal S83 output from the decoder 87 is "001" (see FIG. 32).

Terminals of the delay gates in the programmable delay circuits 84 and 85 selected by the set value "001" of the select signal S83 correspond to the input terminal and the output terminal of the delay gate G8, respectively. At this time, however, the input terminal of the selector 89 is changed over to the side opposite to the delay gate 90 in response to the logic "1" of the least significant bit PWD(0). Accordingly, the set pulse S84 and the reset pulse S86 become respectively the set signal S88 and the reset signal S89 as they are (FIGS. 29F and 29G), so that the output pulse $PWM_{OUT}$ has a pulse width of "1".

Then, in the case where the pulse width set by the pulse width setting data PWD is "3", etc. and finally in the case where the pulse width is "15" (FIGS. 31F to 31H), the output pulse $PWM_{OUT}$ symmetrical about the center of the pulse cycle T is also delivered in a like manner.

With the above configuration, the output pulse having a waveform symmetrical about the center of the pulse cycle T can be obtained by determining whether the pulse width is odd or even, in accordance with the least significant bit PWD(0) of the pulse width setting data PWD, delaying the set pulse S84 through one step of the delay gates and applying it to the set input terminal of the RS-FF circuit 88 when the pulse width is even, and applying the set pulse S84 directly to the set input terminal of the RS-FF circuit 88 when the pulse width is odd.

As a result, an adder which has been essential in the past for generating a set pulse can be dispensed with, making it possible to reduce the number of devices used and cut down the processing time required.

Also, power consumption can be remarkably reduced. Further, the above configuration requires no addition of new circuits even when the bit number of the pulse width setting data is more than four.

(9) Twenty-First to Twenty-Fifth Embodiments

The twenty-first embodiment of this invention will be described.

In the above twentieth embodiment, the description has been made as dividing the pulse cycle T into two first and second halves, and controlling rising or falling of the output pulse in each half. However, this invention is not limited thereto and may be modified so as not to divide the pulse cycle into two durations, or to divide the pulse cycle into three or more durations and control rising or falling of the output pulse by plural stages of programmable delay circuits connected in series corresponding to the respective durations.

The twenty-second embodiment of this invention will be described.

Also, in the above embodiment, the description has been made as setting the RS-FF circuit 88 by the front-stage programmable delay circuit 84 and resetting the RS-FF circuit 88 by the latter-stage programmable delay circuit 85. However, this invention is not limited thereto and may be modified so as to reset the RS-FF circuit 88 by the programmable delay circuit 84 and set the RS-FF circuit 88 by the latter-stage programmable delay circuit 85. In this case, the output pulse can be reversed in its polarity, i.e., positive and negative levels, with respect to the above embodiment.

The twenty-third embodiment of this invention will be described.

While the above embodiment has been described in connection with the case where means for adjusting the set pulse S84 is constituted by the selector 89 and the delay gate 90, this invention is not limited thereto and may be applied to other circuit configurations.

The twenty-fourth embodiment of this invention will be described.

Furthermore, while the above embodiment has been described in connection with the case where the timing of outputting the set pulse S84 is adjusted by the selector 89, this invention is not limited thereto and may be modified so as to adjust the timing of outputting the reset pulse S86.

The twenty-fifth embodiment of this invention will be described.

Additionary, while the above embodiment has been described in connection with the case where a laser diode of laser-beam printers is driven by the output pulse delivered from the pulse width modulation apparatus 81, this invention is not limited thereto and may also be applied to other various electronic equipment such as digital copying machines.

(10) Effects of Invention Regarding to Twentieth to Twenty-Fifth Embodiments According to this invention, as described above, by providing output modifying means for controlling switch-over as to whether one of a set pulse and a reset pulse output from delay means is applied to latch means after delay through a unit pulse delay time or not, based on a set value of pulse width setting data, and enabling a time difference between the set pulse and the reset pulse, which are generated with the same time difference, to be adjusted by a unit pulse delay time, there can be easily obtained a pulse width modulation apparatus which has the simpler configuration than conventional and can produce the same output result as that provided by an arithmetic circuit which has been used for generating an output pulse to be symmetrical about the center of the pulse cycle.

(11) Twenty-Sixth Embodiment

The twenty-sixth embodiment of this invention will be described below with reference to drawings.

Figure 33:
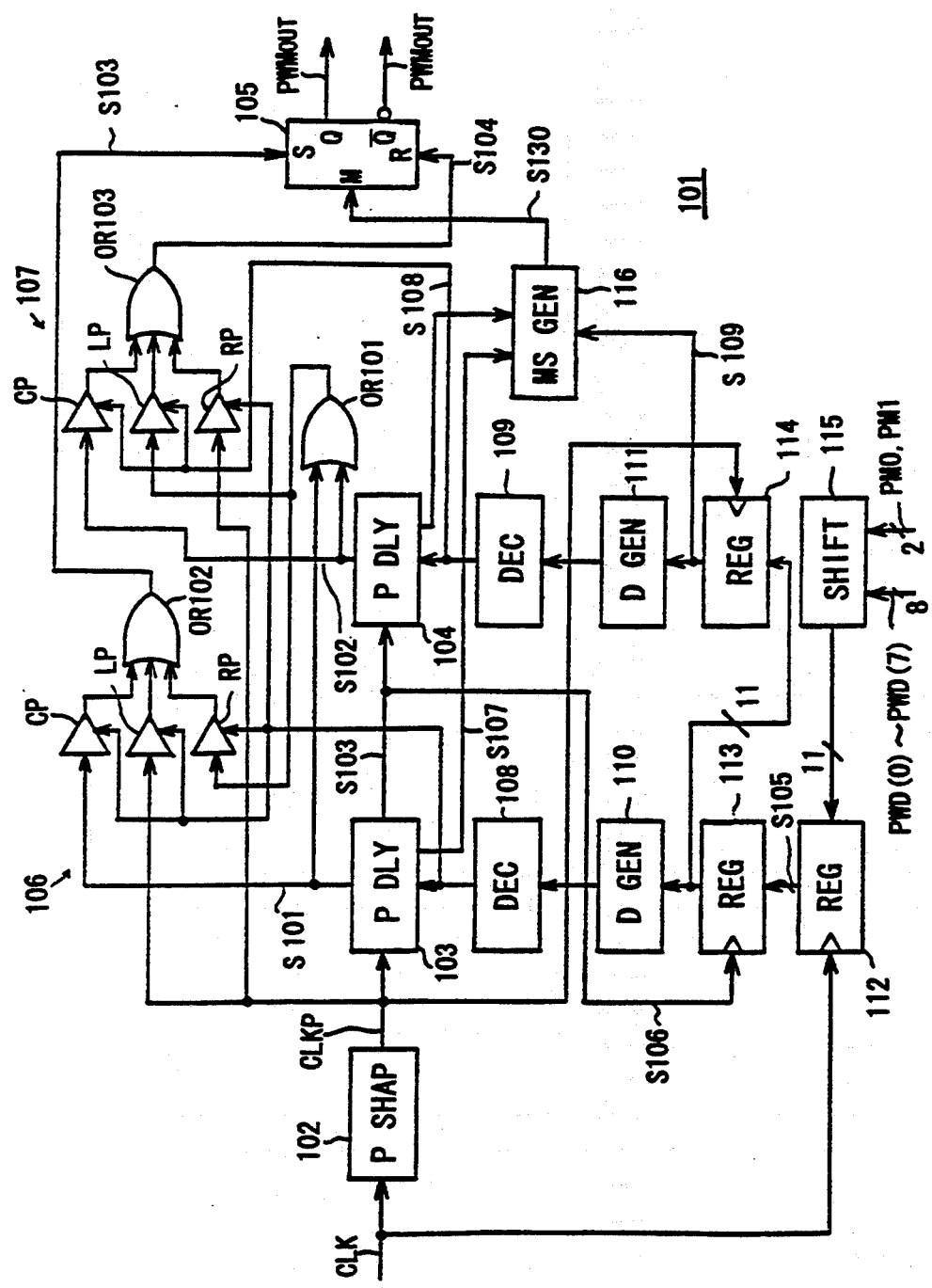
FIG. 33 is a block diagram showing the twenty-sixth embodiment of a pulse width modulation apparatus of this invention.

In FIG. 33, 101 designates a pulse width modulation apparatus as a whole by which a reference position for generating an output pulse with an optional pulse width can be selected at each clock cycle from plural output pulse generation reference positions.

In this embodiment, the pulse width modulation apparatus 101 is provided with three kinds of pulse modes for determining the generation reference positions or a center pulse mode (CP), left pulse mode (LP) and right pulse mode (RP), which correspond to a mode for generating an output pulse $PWM_{OUT}$ by using the central position of a clock cycle T as a reference (FIG. 34B), a mode for generating the output pulse $PWM_{OUT}$ from the left position of the clock cycle T (FIG. 34C), and a mode for generating the output pulse $PWM_{OUT}$ from the right position of the clock cycle T (FIG. 34D), respectively.

General configuration of the embodiment will be described.

The arrangement of each portion of the pulse width modulation apparatus 101 will be described below in sequence.

Here, description will be made from the creation of a clock pulse CLKP to be input to programmable delay circuits.

In the pulse width modulation apparatus 101, a clock signal CLK with a duty ratio 50[%] corresponding to the pulse cycle T of an output pulse is input to a pulse shaper 102 which converts the same into a clock pulse CLKP with a narrow clock width. Subsequently, the pulse width modulation apparatus 101 inputs the clock pulse CLKP is input to two-stage programmable delay circuits 103 and 104 corresponding to the first and second halves of the pulse cycle T.

Each of the programmable delay circuits 103 and 104 is composed of a multi-stage delay gate for outputting the clock pulse CLKP output from the pulse shaper 102 by delaying the same by a predetermined time, the multi-stage delay gate being connected in series to a selection gate corresponding thereto. As a result, the programmable delay circuits 103 and 104 output a first delay pulse S101 and a second delay pulse S102 at timings set based on pulse width setting data PWD.

In general, the first and second delay pulses S101 and S102 will be directly supplied to the set input terminal S and reset input terminal R of an RS-FF circuit 105 as they are to generate an output pulse. In this embodiment, however, the first and second delay pulses S101 and S102 are corrected by set/reset control circuits 106 and 107 so that an output pulse is caused to be risen up or fallen down at a position corresponding to each mode.

The switching gates CP, LP, RP of each of the set/reset control circuits 106 and 107 correspond to the center pulse mode, left pulse mode and right pulse mode, respectively, deliver input pulses therefrom only when a corresponding mode is selected and are set to the logic "L" level in other modes.

When the center pulse mode CP is selected, the first and second delay pulses S101 and S 102 are passed through the switching gates CP and supplied to the RS-FF circuit 105 as a set pulse S103 and a reset pulse S104.

Further, when the left pulse mode LP is selected, the clock pulse CLKP is supplied through the switching gate LP of the set/reset control circuit 106 to the set terminal S as set pulse S103 so that the output pulse is risen up by the clock pulse CLKP, and the first delay pulse S101 or second delay pulse S102 is supplied through the switching gate LP of the set/reset control circuit 107 to the reset terminal R as the reset pulse S104.

In the same way, when the right pulse mode RP is selected, the clock pulse CLKP is supplied through the switching gate RP of the set/reset control circuit 107 to the reset terminal R as reset pulse S104 so that the output pulse is fallen down by the clock pulse CLKP, and the first delay pulse S101 or second delay pulse S102 is supplied through the switching gate RP of the set/reset control circuit 106 to a set input terminal S as the set pulse S103.

The switching of the modes in the set/reset control circuits 106 and 107 and the setting of a delay time in the programmable delay circuits 103 and 104 for outputting the first and second delay pulses S101 and S102 are controlled by the following circuits.

First, the delay time of the programmable delay circuits 103 and 104 are controlled by decoders 108 and 109 for decoding the output data from data generation circuits 110 and 111.

The data generation circuits 110 and 111 transpose the pulse width setting data PWD fetched at a timing offset by one half cycle based on mode selection data PM (FIGS. 36A to 36E).

In the center pulse mode CP, the data generation circuits 110 and 111 supply the pulse width setting data PWD to the decoders 108 and 109 as it is (FIG. 36B). In the left pulse mode LP, they supply the pulse width setting data PWD with the first half cycle thereof inverted (FIG. 36D). This is because that the decoders 110 and 111 set low order bits to the center position of the cycle T for use with the center pulse mode CP and set a maximum amplitude to the left side or right side so that as a pulse width to be given is increased, the position of a delay gate selected by the decoder is moved from the left to the right.

In the same way, in the right pulse mode RP, the pulse width setting data PWD is supplied with the second half cycle thereof inverted, so that as a pulse width to be given is increased, the position of a delay gate selected by the decoder 109 is moved from the right to the left (FIG. 36E).

Further, the pulse width setting data PWD and mode selection data PM are supplied to the data generation circuits 110 and 111 at the following timing.

First, when the pulse width modulation apparatus 101 fetches the pulse width setting data PWD for a next pulse cycle and the mode selection data PM thereof (FIG. 35C) to a first-stage register 112 and stores the same therein at the timing when the clock signal CLK rises up (FIG. 35D).

Subsequently, when a delay pulse S106 (FIG. 35E) delayed by one half cycle is output from the programmable delay circuit 103 of the prestage, a second step register 113 fetches the pulse width setting data PWD and mode selection data PM, which are to be output to the decoder 108 for the first half cycle being in pause at present, from the first step register 112 and rewrites the same (FIG. 35F).

Since the delay pulse S106 is supplied after the completion of the half cycle, the decoder 108 will complete the decode of the pulse width setting data PWD before the clock pulse CLKP reaches the final stage of the programmable delay circuit 104. Then, the stage number of the delay gate from which an output is selected is set before the clock pulse CLKP corresponding to the next pulse cycle T is input to the programmable delay circuit 103.

Shortly, when the clock pulse CLKP at the next pulse cycle T is output from the pulse shaper 102, a third step register 114 fetches the pulse width setting data PWD and mode selection data PM to be output to the decoder 109 for the second half cycle which is in pause at present from the second step register 113 and rewrites the same (FIG. 35H).

Then, the decoder 109 completes the decode of the pulse width setting data PWD before the clock pulse CLKP reaches the final stage of the programmable delay circuit 103, in the same way as described with respect to the decoder 108, and the stage number of the delay gate from which an output is selected is set before the clock pulse CLKP is input to the programmable delay circuit 104.

As described above, the rising position and falling position of the output pulse set by the programmable delay circuits 103 and 104 are divided into the first half cycle and second half cycle and the delay time of one of the programmable delay circuits is set while the other circuit is in operation. Therefore, no blank duration is caused by the delay of the decode even at the starting time of the output pulse.

Incidentally, the pulse width setting data PWD fetched to the first step register 112 is digital data of 9 bits which is larger by 1 bit than the pulse width setting data PWD(0) to PWD(7) of 8 bits actually input to the pulse width modulation apparatus 101. This 1 bit is data of the logic "L" so that a switching control is effected with respect to whether the pulse width setting data PWD is shifted by 1 bit or not in response to the mode selection data PM.

This relationship will be described with reference to FIG. 37. FIG. 37 shows an example when the center pulse mode CP is selected, in where since all the ten switches provided with a shifter 115 are switched to the left side, the pulse width setting data PWD is delivered as it is and data of the logic "L" is written to a ninth bit.

Whereas, when other mode such as the left pulse mode LP or the right pulse mode RP is selected, all the switches are switched to the right side and the pulse width setting data PWD is shifted to a high order bit side by 1 bit.

Further, in this embodiment, the RS-FF circuit 105 is provided with a priority switching mode for providing priority with any one of the set input and reset input so that the RS-FF circuit 105 is not unstable even if both the set signals S103 and S104 supplied to the set input terminal S and reset input terminal R of the RS-FF circuit 105 are at the logic "H" level.

Figure 38:
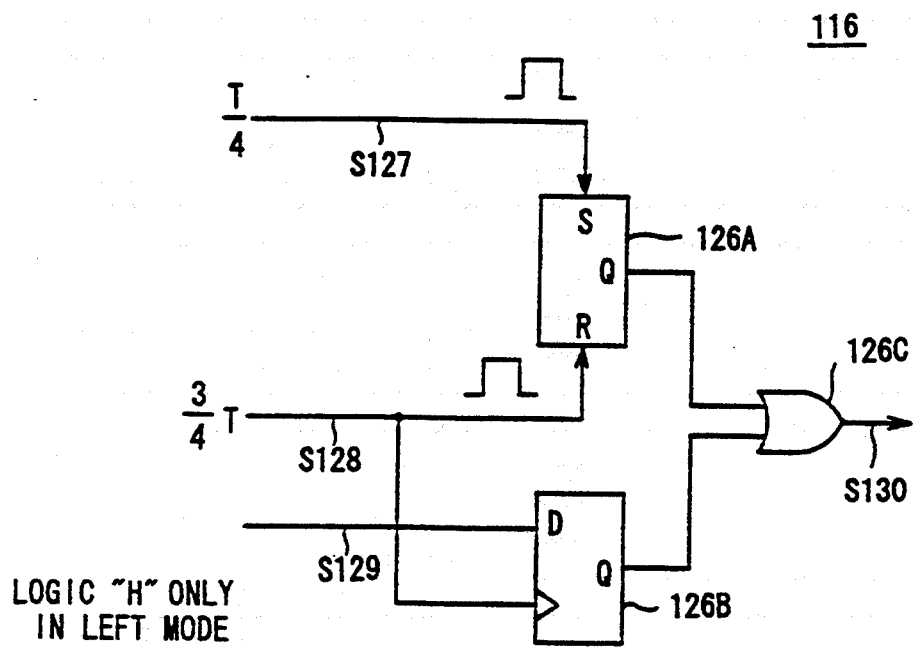
FIG. 38 is a block diagram showing a mode switch signal switch circuit shown in FIG. 33.

As shown in FIG. 38, the switching of the priority is controlled by a mode switch signal S130 output from a mode switch signal generation circuit 116 composed of logic gates 126A, 126B and 126C shown in FIG. 38. When the mode switch signal S130 is at the logic "H" level, the priority is switched to a reset priority mode and when the signal at the logic "L" level, the priority is switched to a set priority mode.

Figure 39A:
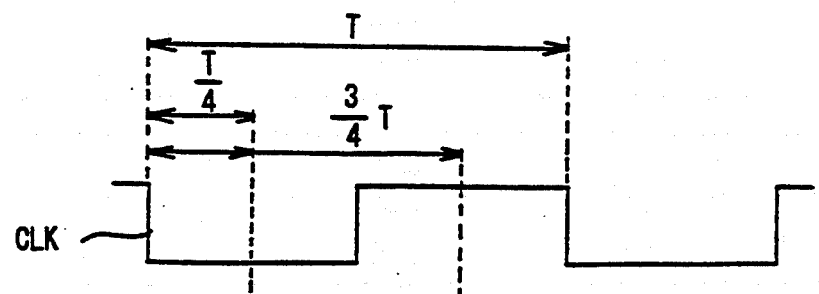

More specifically, the mode switch signal S130 rises up to the logic "H" level in response to a timing signal S127 output from the programmable delay circuit 103 (which is output at the timing of one half the first half cycle (i.e., at the timing of one quarter a pulse cycle)); and the mode switch signal S130 falls down in response to a timing signal S128 output from the programmable delay circuit 124 (which is output at the timing of one half the first half cycle (i.e., at the timing of three quarter the pulse cycle)) (FIGS. 39B and 39D).

In the left pulse mode LP, however, the mode switch signal S130 rises up in response to the timing signal S128 so that the priority is controlled to a reset priority state at all times (FIG. 39C).

FIGS. 40A to 40D show output waveforms generated in the respective pulse modes and the periods of the priority modes related in the respective modes.

That is, in the center pulse mode CP, the priority mode is effective for a certain period from the start point of the pulse cycle T and a certain duration from the central point thereof; and in the left pulse mode LP and right pulse mode RP, the priority mode is effected for a certain period from the start point of the pulse cycle T. At this time, a length of each priority period is equal to or less than the pulse width of the clock pulse CLK.

In the above configuration, it will be described by using FIGS. 41A to 41E that the output pulse PWM having a cycle slower than that of the clock signal CLK can be output while keeping the cycle T of the clock signal CLK as it is.

Here, "00" means that all the pulse width setting data PWD is at the logic "L" level and "FF" means that all the pulse width setting data PWD is at the logic "H" level.

When, "RP", "FF", "LP", "00", "RP", ... are successively given as, for example, 8-bit data for setting a pulse width or mode switch data PM, a pulse, which bridges over three cycles and is composed of an output pulse for a single clock cycle with an output pulse having a pulse width corresponding to set data integrally added to each side of the output pulse, a blank duration, a pulse bridging over two cycles, etc., can be obtained as the output pulse PWM output from the RS-FF circuit 105 (FIG. 41B).

This waveform seemingly corresponds to the one which can be obtained when the delay line of the programmable delay circuits 123 and 124 has a length approximately three times the delay line of the cycle T of the clock signal CLK (FIG. 41C).

In this embodiment, however, a delay line which is one third the one needed in this case is sufficient, and thus a circuit size and power consumption can be greatly reduced.

Further, in the same way, when "RP", "FF", "FF", "LP", "00", "RP", "LP", ... are successively given as 8-bit data for setting a pulse width or mode switch data PM, a pulse, which bridges over four cycles and is composed of an output pulse for two clock cycles with an output pulse having a pulse width corresponding to set data integrally added to each side of the output pulse, a blank duration, a pulse bridging over two cycles, etc., can be obtained as the output pulse PWM output from the RS-FF circuit 105 (FIG. 41D).

This waveform seemingly corresponds to the one which can be obtained when the delay line of the programmable delay circuits 123 and 124 have a length approximately four times the delay line of the cycle T of the clock signal CLK (FIG. 41E).

According to the above arrangement, an output pulse of low resolution exceeding a clock cycle can be realized by a processing circuit which is greatly smaller than a conventional one in such a manner that the mode switch data PM is supplied together with the pulse width setting data PWD and an output pulse with an arbitrary width is Generated by switching the output pulse generation reference positions of the output pulse at each clock cycle.

Further, since the length of a delay line can be shortened as compared with resolution, a power consumption can be more reduced.

Further, since the output pulse generation reference positions can be switched at any arbitrary location, this embodiment is particularly suitable when an oblique line and the like are printed.

(12) Twenty-Seventh Embodiment

The twenty-seventh embodiment of this invention will be described.

In the above embodiment, although the case is described in which the three kinds of the pulse modes or the center pulse mode CP, right pulse mode RP and left pulse mode LP are prepared as the modes for setting the output pulse generation reference positions, this invention is not limited thereto, but four or more kinds of the modes may be prepared.

The twenty-eighth embodiment of this invention will be described.

Further, in the above embodiment, although the case is described in which the modes of the RS-FF circuit 105 having the capability for switching the priority are switched by the mode switch signal generation circuit 116 arranged as shown in the figure, they may be switched by using other circuit arrangement.

The twenty-ninth embodiment of this invention will be described.

Further, the above embodiment is described with respect to the case in which the mode switch signal generation circuit 116 switches the modes at the timing of one quarter cycle (T/4) of the pulse cycle T or three quarter cycle thereof (3T/4), this invention is not limited thereto, but the modes may be switched at any other timing. In this case, when it is assumed that a period from the start or intermediate point of the pulse cycle T to the time when a priority period is switched is designated by $\tau 1$, this period $\tau 1$ may be set to any period so long as it is longer than the pulse width $\tau 2$ of the clock pulse CLKP.

The thirtieth embodiment of this invention will be described.

Further, in the above embodiment, although the data generation circuits 110 and 111 are described with respect to the case in which the arrangement of data is transposed as shown in FIGS. 36A to 36E, this invention is not limited thereto, but the data of the modes to be used as reference may be suitably selected.

The thirty-first embodiment of this invention will be described.

Further, in the above embodiment, although the case is described in which the pulse cycle T is divided into the two periods or the first half and second half periods and the rising and falling of the output pulse is controlled with respect to each period, this invention is not limited thereto, but the pulse cycle T need may not be divided or may be divided into plurality periods of at least three periods and the rising and falling of the output pulse may be controlled by each of multi staged programmable delay circuits connected to each other in series in correspondence to the respective cycles.

The thirty-second embodiment of this invention will be described.

Further, in the above embodiment, although the case is described in which the clock signal CLK is converted to the clock pulse CLKP with a narrower pulse width so that the rising of the set pulse S101 input to the RS-FF circuit 105 does not overlap with that of the reset pulse S102 input thereto, this invention is not limited thereto, but the same effect can be obtained without using the pulse shaper 102. With this arrangement, a power consumption can be reduced as well as the number of elements can be more reduced.

The thirty-third embodiment of this invention will be described.

Further, in the above embodiment, although the case is described in which the RS-FF circuit 105 is set by the set pulse S103 output from an OR circuit OR102 and reset by the reset pulse S104 output from an OR circuit OR103, this invention is not limited thereto, but the set pulse S103 and reset pulse S104 may be input to the opposite input terminals, respectively.

With this arrangement, the logic "H" and "L" levels of the output pulse can be inverted from those of this embodiment.

The thirty-fourth embodiment of this invention will be described.

Further, in the above embodiment, although the case is described in which the laser diode of a laser-beam printer is driven by the output pulse output from the pulse width modulation apparatus 101, this invention is not limited thereto but widely applicable to generally used electronic apparatus such as a digital copy machine and the like.

(12) Effects of Invention Regarding to Twenty-Sixth to Thirty-Fourth Embodiments As described above, according to this invention, the pulse width modulation apparatus capable of outputting an output pulse having a cycle longer than the clock cycle can be easily obtained in such a manner that a reference position serving as a reference when the output pulse is generated is selected from plural the reference positions at each clock cycle and the output pulse is generated in response to control pulses delayed in accordance with the selected reference position.

(13) Thirty-Fifth Embodiment

The thirty-fifth embodiment of this invention will be described below with reference to drawings.

Figure 42:
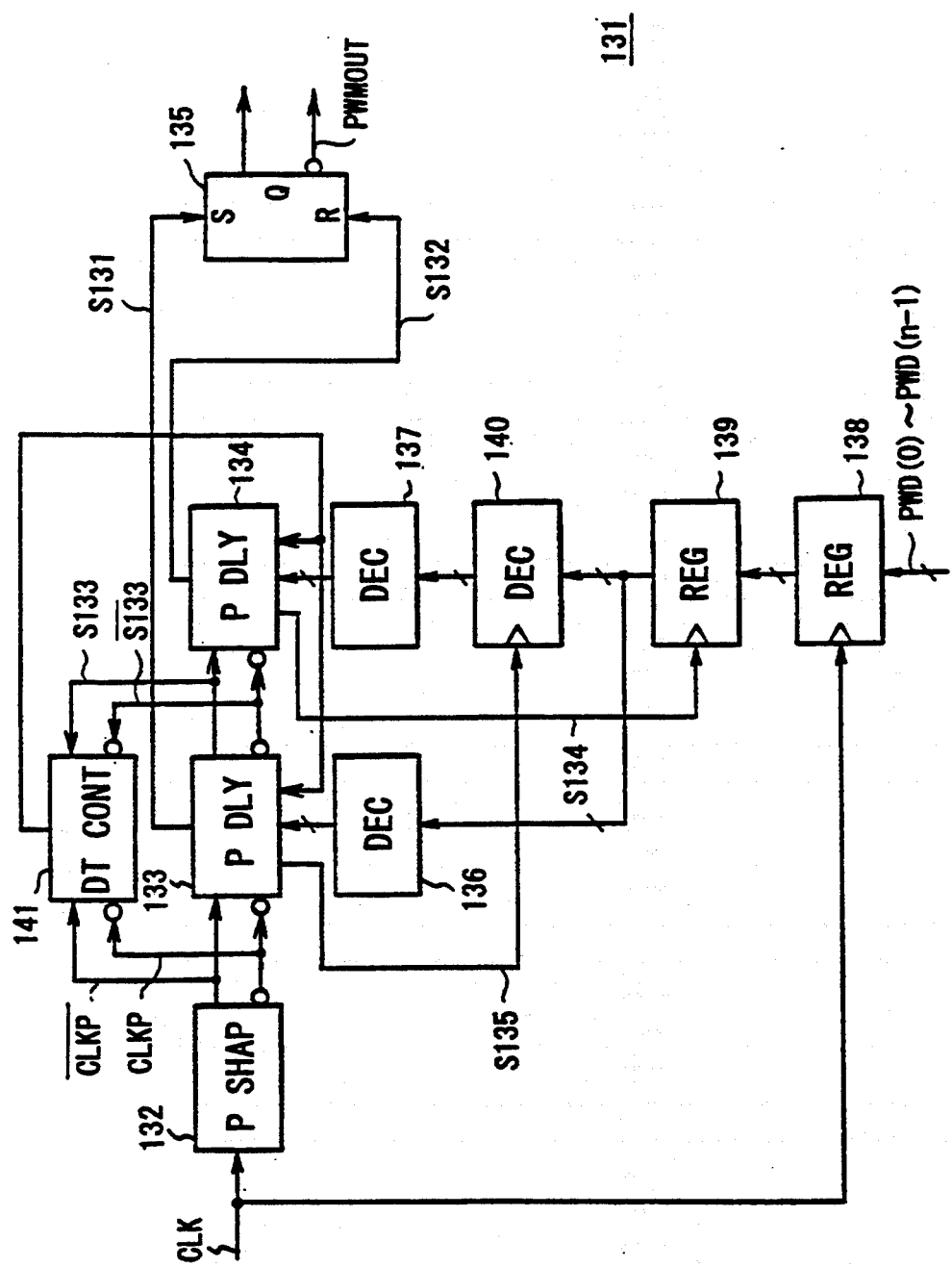
FIG. 42 is a block diagram showing the thirty-fifth embodiment of a pulse width modulation apparatus of this invention.

Referring to FIG. 42, 131 generally denotes a pulse width modulation apparatus in which two-stages of programmable delay circuits are connected in series correspondingly to a first half cycle and a second half cycle of a pulse cycle T where, during operation of one of the programmable delay circuits, delay time of the other programmable delay circuit is to be set.

Here, the pulse width modulation apparatus 131 is adapted to convert clock signal CLK of duty ratio 50[%] corresponding to pulse cycle T of the output pulse into a clock pulse having relatively narrow pulse width through a pulse shaper 132 and to input the clock pulse CLKP to the series-connected programmable delay circuits 133 and 134.

The programmable delay circuits 133 and 134 are each constructed by a series connection of plural stages of delay gates for providing the clock pulse CLKP output from the pulse shaper 132 with a delay of a certain time period by each stage and selector gates respectively corresponding to the delay gates. They are adapted to output set pulse S131 and reset pulse S132, respectively, to RS-FF circuit 135 at timings set by pulse width setting data PWD.

Delay time of the programmable delay circuits 133 and 134 is controlled, respectively, by two sets of decoders 136 and 137 and the pulse width setting data PWD is to be taken from the registers 139 and 140 into the respective decoders 136 and 137 at timings shifted by one half cycle from each other.

Taking in of the pulse width setting data PWD is effected based on the timing as follows. First, the pulse width modulation apparatus 131 reads out to and retains at a first stage register 138 the pulse width setting data PWD for the next pulse cycle at the ascending timing of the clock signal CLK. Subsequently, when a read enabling signal S134 is output from the programmable delay circuit 134 at the latter stage, the second step register 139 takes in from the first step register 138 and rewrites the pulse width setting data PWD to be output to the decoder 136 corresponding to the first half cycle, which is currently in its inactive state.

Since the read enabling signal S134 is to be output from substantially the center position of the delay gate stages which constitute the programmable delay circuit 134, the decoder 136 completes decoding of the pulse width setting data PWD by the time at which the clock pulse CLKP reaches the last stage of the programmable delay circuit 134 whereby it determines setting as to output of which delay gate stage is to be selected by the time at which clock pulse CLKP corresponding to the next pulse cycle T is input to the programmable delay circuit 133.

Shortly, when a read enabling signal S135 is output upon passing of the clock pulse CLKP of the next pulse cycle T through the delay gate stage positioned at substantially the center of the programmable delay circuit 133, a third step register 140 takes in from the second step register 139 and rewrites the pulse width setting data PWD to be output to the decoder 137 corresponding to the second half cycle, which is currently is in its inactive state.

Then, in a similar manner as the case described with respect to the decoder 136, the decoder 137 completes decoding of the pulse width setting data PWD by the time at which the clock pulse CLKP reaches the last stage of the programmable delay circuit 133 and sets from which steps of the delay gates an output is to be selected before inputting of this clock pulse CLKP to the programmable delay circuit 134.

As described, in setting of rising position and falling position of the output pulse, by dividing the output pulse into the first half cycle and the second half cycle to set delay time of one during the operation of the other, a blank duration due to delay in decoding can be removed even at starting of the output pulse So that the entire cycle of the clock cycle T can be effectively used.

Further, the pulse width modulation apparatus 131 includes a delay time control circuit 141 which is capable of adjusting delay time of the programmable delay circuit 133 as a whole so that it coincides the period of the clock pulse CLKP, by effecting feedback control of idling current flowing through each delay gate.

The thirty-sixth embodiment of this invention will be described.

Figure 43:
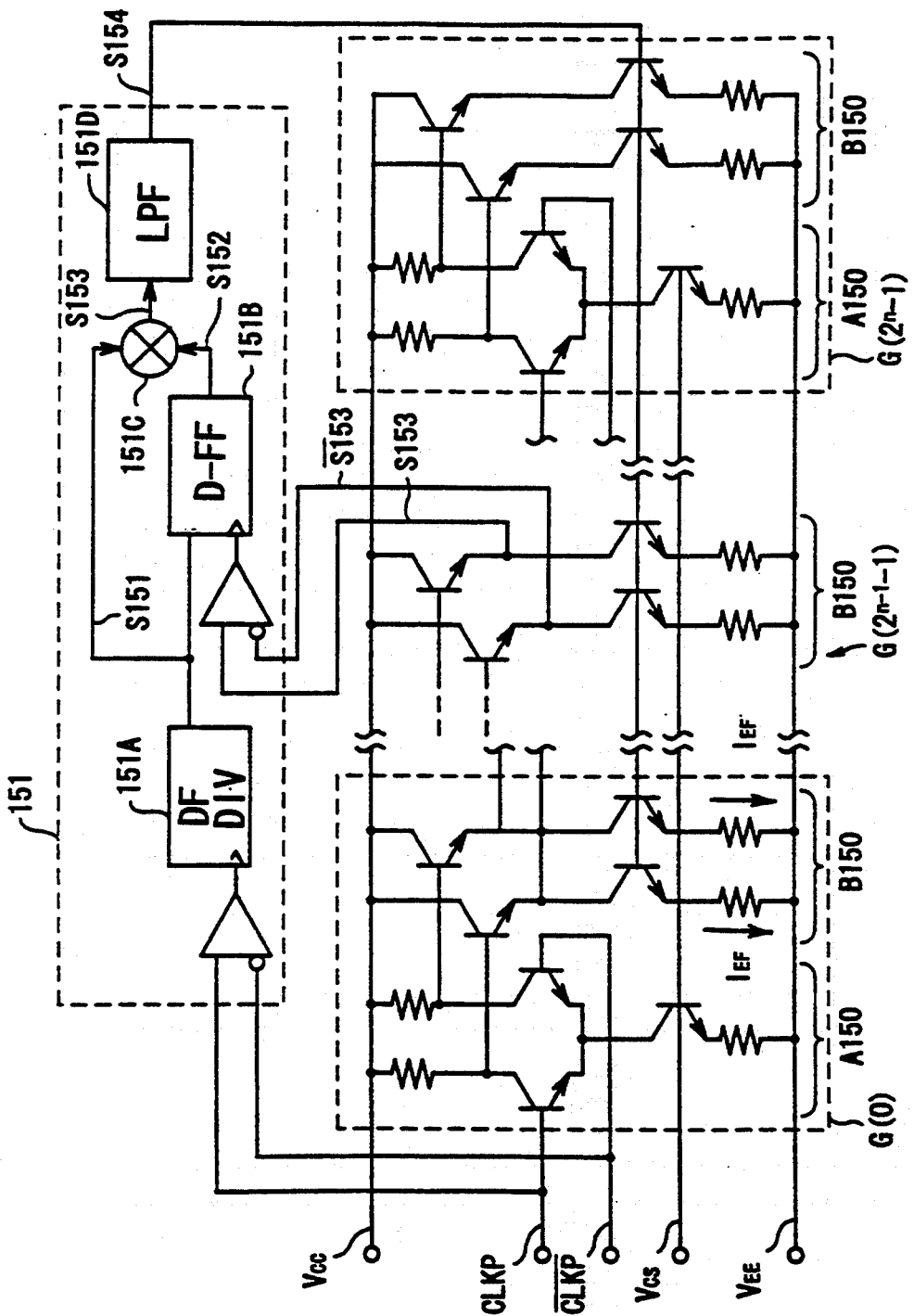
FIG. 43 is a block diagram showing an embodiment of a delay time control circuit shown in FIG. 42.

In FIG. 43, 151 denotes the configuration of the delay time control circuit 141.

In the case of this embodiment, the delay time control circuit 151(141) is adapted to first input the clock pulse CLKP output from the pulse shaper 142 (or an inverted output ICLKP thereof) into a one half frequency divider 151A to divide its frequency in two (FIG. 43).

Subsequently, the delay time control circuit 141 supplies a frequency-divided signal S151 output from the one half frequency divider 151A to a D-FF circuit 151B and a multiplier 151C and provides the frequency-divided signal S151 from the D-FF circuit 151B with a delay corresponding to delay time by the programmable delay circuit 143.

Here, the multiplier 151C multiplies the frequency-divided signal S151 and a timing signal S152 which is the output of the D-FF circuit 151B, so as to enable a multiplied output S153 to rise the logic "H" level for the time period during which the output levels of the two signals are different from each other.

The delay time control circuit 151 converts the multiplied output S153 into a voltage through a low-pass filter 151D and feeds it as a bias voltage adjusting signal S154 back to emitter follower output step of delay gates G0, G1, G2 . . . G (nth power of 2−1).

Specifically, an emitter current $I_{EF}$ is increased/decreased by increasing/decreasing a base voltage of a transistor constituting the current source of an emitter follower output step B by the bias voltage adjusting signal S154, so as to make variable the speed by which an output is caused to occur at the output end of the emitter follower output step B.

In other words, if the bias voltage to be given by the bias voltage adjusting signal S154 is relatively low, delay time may be made correspondingly longer because the output speed becomes slower. If the bias voltage is relatively high, delay time may be made correspondingly shorter because the output speed becomes higher.

A description will now be given with respect to the constitution as described above, of adjusting operation of unit delay time of the programmable delay circuits 133 and 134, which provide set pulses S131 and S132, respectively, at optional timings based on the pulse width setting data PWD.

The pulse width modulation apparatus 131 decodes the pulse width setting data PWD provided for each pulse cycle by taking it into decoders 136 and 137 at predetermined timings and delivers outputs of the delay gates selected by the decoders 136 and 137 as the set pulses S131 and S132 to the RS-FF circuit 135, thereby providing an output pulse having an optional pulse width.

At the same time, the pulse width modulation apparatus 131 uses the delay time control circuit 141(151) to effect feedback control on unit delay time of each delay gate in the programmable delay circuits 133 and 134 so that it coincides a time period which may be uniquely determined from the pulse cycle T.

Figures 44A, 44B, 44C, 44D, 44E:
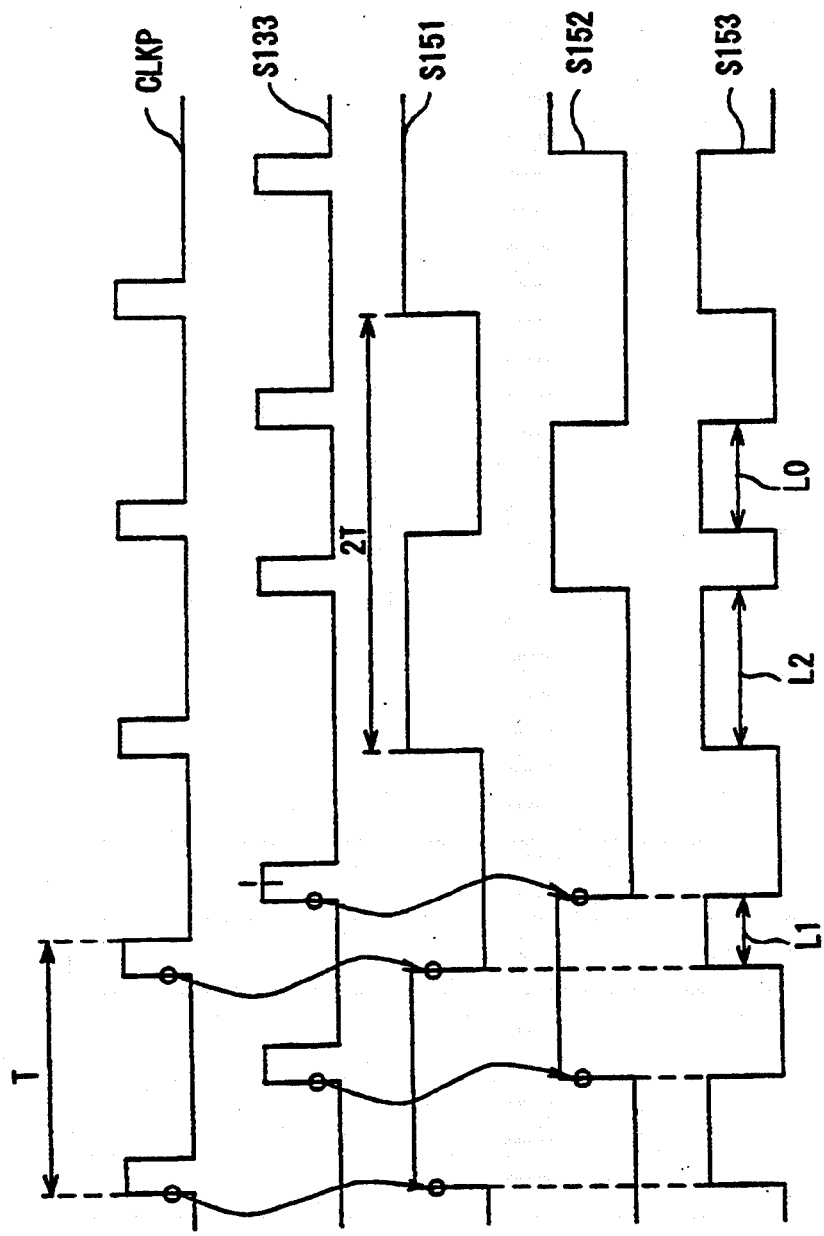
FIGS. 44A to 44E are signal waveforms explaining the operation of the delay time control circuit shown in FIG. 43.

Here, when the clock pulse CLKP (FIG. 44A) is input from the pulse shaper 132, the delay time control circuit 141(151) divides its frequency through the one half frequency divider 151A to obtain the frequency-divided signal S151 (FIG. 44C) having a period (2T) that is twice the pulse cycle T and supplies it to the multiplier 151C.

On the other hand, the delay time control circuit 141(151) shifts the phase of the frequency-divided signal S151 by the D-FF circuit 151B by means of a delayed output S133 which is obtained by delaying the clock pulse CLKP for a time corresponding to the total delay time of the programmable delay circuit 133 and delivers it as the timing signal S152 (FIG. 44D) to the multiplier 151C.

At this time, if the unit delay time of each of the delay gates G0 to G ((n−1)th power of 2−1) in the programmable delay circuit 133 coincides one half of the pulse cycle T, the phase difference between the frequency-divided signal S151 and the timing signal S153 becomes exactly 90°, where the pulse of the multiplied output S153 (FIG. 44E) thereof becomes L0.

On the other hand, if unit delay time of each delay gate is Shorter than the theoretical delay time for example due to production variance, timing for outputting the delay signal S133 is also shorter than the theoretical timing. Thus, the pulse width L1 of the multiplied output S153 of the frequency-divided signal S151 and the timing signal S152 becomes shorter than the pulse width L0.

Thereby, the voltage value of the bias voltage adjusting signal S154 to be feedbacked through the low-pass filter 151D becomes lower to reduce the ability for providing the emitter current $I_{EF}$ where unit delay time per one step of delay gate is correspondingly made longer. As a result, delay time of the programmable delay circuits 133 and 134 as a whole is controlled so that it coincides the pulse cycle T.

Further, if, on the contrary, unit delay time of each delay gate is longer than the theoretical delay time for example due to production variance, the timing signal for outputting the delay output S133 is also longer than the theoretical timing. Thus, the pulse width L2 of the multiplied output S153 of the frequency-divided output S151 and the timing signal S152 becomes longer than the pulse width L0.

In this case, the voltage value of the bias voltage adjusting signal S154 to be feedbacked through the low-pass filter 151D becomes higher to increase the ability for providing the emitter current $I_{EF}$ where unit delay time per one step of delay gate is correspondingly made shorter. As a result, delay time of the programmable delay circuits 133 and 134 as a whole is controlled so that it coincides the pulse cycle T.

According to the construction as described: multiplication is performed to the frequency-divided signal S151 divided into one half the frequency of the clock pulse SLKP which is input to the programmable delay circuit 133 and the timing signal S152 delaying the frequency-divided signal S151 by time period corresponding to delay time of the programmable delay circuit 133; the bias voltage on emitter follower output step of each delay gate is controlled by the result of the multiplication; thereby unit delay time of each delay gate can be set to the theoretical delay time which is determined by the pulse cycle even when unit delay time of each delay gate fluctuates due to use environment and/or production variance.

As a result, an accurately graduated representation may be expected.

Further, since unit delay time of the delay gates in the programmable delay circuits 133 and 134 can be feedbacked so that it coincides the pulse cycle, pulse cycle T of the clock signal CLK input to the pulse width modulation apparatus 131 can be adjusted within an adjustable range by increasing/decreasing the emitter current $I_{EF}$ flowing to the current source of the emitter follower output stage where the pulse width of the output pulse even after fabrication can be adjusted within a certain range.

Since, in this manner, an error in unit delay time due to change in pulse width or production variance can be adjusted, yield at the time of fabrication can be further improved comparing to the conventional example.

The thirty-seventh embodiment of this invention will be described.

In the above described embodiment, the description has been given with respect to a case where the one half frequency divider 151A and the D-FF circuit 151B are operated by using the clock pulse CLKP and the delayed output S133 from the programmable delay circuit 133. This invention is not limited to this, however, and their respective opposite-phase outputs, an inversion clock pulse ICLKP and an inversion delayed output IS3, may also be used.

The thirty-eighth embodiment of this invention will be described.

Further, in the above described embodiment, the description has been given with respect to a case where the frequency of the clock pulse CLKP is divided into one half and the delayed output S133 different in phase substantially by 90° with respect to the frequency divided signal S151 is extracted from the output end of the programmable delay circuit 133 corresponding to the center position of the delay gate group. This invention is not limited to this, however, and it is also possible to set the frequency dividing ratio to another value and to extract a delayed output corresponding to such frequency dividing ratio from a predetermined position in the delay gate group.

The thirty-ninth embodiment of this invention will be described.

Further, in the above described embodiment, the description has been given with respect to a cascade where the multiplication output S153 of the frequency divided signal S151 and the timing signal S152 is converted into a voltage by using the low-pass filter 151D. This invention is not limited to this, however, and it is also possible to use another filter means.

The fortieth embodiment of this invention will be described.

Further, in the above described embodiment, the description has been given with respect to a case where the pulse cycle T is divided into the two time periods of first and second halves and rising and falling of the output pulse is controlled with respect to each time period. This invention is not limited to this, however, and the pulse cycle may not be divided. Further, it may also be divided into three or more time periods so that rising or falling of output pulse may be controlled respectively by plural steps of programmable delay circuits serially connected corresponding to the periods.

The forty-first embodiment of this invention will be described.

Further, in the above described embodiment, the description has been given with respect to a case where the RS-FF circuit 135 is set by the programmable delay circuit 133 at the former stage and the RS-FF circuit 135 is reset by the programmable delay circuit 134 at the latter stage. This invention is not limited to this, however, and it may also be that the RS-FF circuit 135 be reset by the programmable delay circuit 133 and the RS-FF circuit be set by the programmable delay circuit 134. In this way, negative/positive level of the output pulse may be inverted from the case of the embodiment.

(14) Effects of Invention Regarding to Thirty-Fifth to Forty-First embodiments

As has been described, according to this invention, an increase/decrease of unit delay time per one stage of delay element is controlled based on shift in phase between a control pulse input to the delay means and a delay pulse input from one of the plurality of delay elements constituting the delay means. Thereby, when the unit delay time per one step of the delay element is currently too long, control may be effected to make it shorter. Further, when the unit delay time is currently too short, control may be effected to make it longer. It is possible to readily fabricate a pulse width modulation apparatus in which a stable operation may be expected irrespective of the operational environment.

While there has been described in connection with the preferred embodiments of this invention, it will be obvious to those skilled in the art that various changes and modifications may be aimed, therefore, to cover in the appended claims all such changes and modifications as fall within the true spirit and scope of the invention.

What is claimed is:

1. A pulse width modulation apparatus comprising latch means, a delay means for delaying a control pulse fed at intervals of a predetermined period by an arbitrary period of time, said delayed control pulse controlling a setting or resetting of said latch means so as to modulate a pulse width of an output pulse to be delivered, wherein:
   said delay means comprises delay output means having plural stages for producing plural delayed control pulses dividing said intervals into plural durations; and
   a rising or falling of said latch means is controlled based on said delayed control pulses.

2. A pulse width modulation apparatus of claim 1 further comprising multi-stage decoder means for setting delay times for said multi-step delay output means outputting delay outputs by executing pipeline processing.

3. A pulse width modulation apparatus of claim 1, wherein:
   each of said multi step delay output means includes multi step buffer means each of which receives an in-phase input or an anti-phase input via an in-phase input terminal or an anti-phase input terminal thereof in response to said control pulse, delays said in-phase input or anti-phase input by a specified period of time, and then supplies a delayed input to an in-phase input terminal or an anti-phase input terminal in a succeeding stage; and
   multi-stage differential input means each of which is connected between an input terminal and each of said buffer means, and receives said in-phase input or anti-phase input via a differential input terminal thereof; wherein
   collectors of transistors serving as said multi-stage differential input means are connected commonly to first and second load resistors; emitters thereof commonly connected to one another are connected to selection transistors; and when one of said selection transistors is selected according to selection data, a control pulse, which has been delayed by number of stages of said buffer means preceding a differential input means associated with said selected selection transistor and the number of stages of output buffer means, is output as a delayed control pulse via said output buffer means connected to middle points between said load resistors and said collectors.

4. A pulse width modulation apparatus of claim 3, wherein each of said multi-stage delay output means inhibits the output of all delayed control pulses provided by each of said delay output means, when a value of n-bit selection data is all-bit 1 or 0.

5. A pulse width modulation apparatus which uses a delay means to delay a control pulse, which is fed at intervals of a specified period, by an arbitrary period of time, supplies a pulse to a latch means according to said delayed control pulse, controls a rising or a falling to be latched by said latch means, thus modulates a pulse width of an output pulse, and then delivers an output, said pulse width modulation apparatus comprising:
   n-stage delay output means in association with which said pulse period is divided into n durations, and each of which delays a control pulse fed during each of the durations by an arbitrary period of time, and then delivers an output;
   n-stage decoder means each of which pre-sets a delay time for each of said delay output means prior to the start of each of the durations associated with said delay output means; and
   n+1-stage register means each of which supplies selection data for the next period to the associated decoder means after each of said delay output means has output a delayed control pulse for the duration associated therewith;

said latch means supplying an output pulse, which has an arbitrary pulse width with respect to a start point of said pulse period, according to said control pulse fed to the first-stage decoder means and delayed control pulses which have been delayed by specified periods of time by said n-stage delay output means.

6. A pulse width modulation apparatus of claim 5, wherein said latch means supplies an output pulse, which has an arbitrary pulse width with respect to an end point of said pulse period, according to said control pulse fed to the first-stage decoder means and a result of computation of delayed output pulses which have been delayed by specified periods of time by said n-stage delay output means.

7. A pulse width modulation apparatus according to any one of claims 1, 2, 3, 4, 5, and 6, further comprising a pulse width compression means that compresses a pulse width of a clock signal to be sufficiently smaller than said pulse period, and outputs the compressed pulse of the clock signal as said control pulse.

8. A pulse width modulation apparatus which uses a delay means to delay a control pulse, which is fed at intervals of a specified period, by an arbitrary period of time, controls a rising or falling to be latched by a latch means according to the said delayed control pulse, thus modulates a pulse width of an output pulse, and then delivers an output, comprising:

a pulse width compression means which compresses a pulse width of a clock signal to be sufficiently smaller than said pulse period, and outputs the compressed pulse of the clock signal as said control pulse;

first and second delay output means in association with which said pulse period is divided into first and second half periods, and each of which delays a control pulse, which is fed via an input terminal thereof during each of the durations, by an arbitrary period of time, and then supplies the delayed control pulse as a delayed output pulse;

first and second decoder means for setting delay times for said first and second delay output means respectively; and first and second pulse point setting means each of which inputs selection data specifying a pulse width of said output pulse, and provides said first and second decoder means with first or second pulse point change data for use in rearranging said output pulse specified in said selection data substantially symmetrically with respect to a middle point of said pulse period.

9. A pulse width modulation apparatus of claim 8, further comprising a delay means that delays said control pulse by a period of time required for said first and second pulse point setting means to set said pulse point change data, and supplies the delayed control pulse to said first delay output means.

10. A pulse width modulation apparatus of claim 8 or 9, wherein:

said first pulse point setting means has a reverse output means to reverse a plurality of high-order bits of said selection data, and outputs the result of addition of said reversed high-order bits to a reversed output of a least-significant output as said first pulse point change data; and said second pulse point setting means has a reverse output means to reverse a plurality of high-order bits of said selection data, and outputs the result of reversing as said second pulse point change data.

11. A pulse width modulation apparatus of claim 8 or 9, wherein each of said first and second pulse point setting means shifts said selection data by one bit to the right;

calculates a pulse width corresponding to a half of a pulse width of an output pulse, which is specified in said selection data;

and outputs a pulse width, which is calculated by subtracting the pulse width from a pulse width corresponding to a half of said pulse period, as said first pulse point change data;

or outputs the pulse width as said second pulse point change data.

12. A pulse width modulation apparatus in which a control pulse input at a certain period is delayed through arbitrary amount of time by delay means for applying delayed control pulses to a set input terminal and a reset input terminal of latch means, and the pulse width of an output pulse delivered from said latch means is modulated in accordance with the control pulses applied to said set input terminal and said reset input terminal, wherein:

said latch means has means for establishing a set pulse priority mode in which the control pulse applied to said set input terminal is given priority over the control pulse applied to said reset input terminal during a predetermined span of said certain period, and means for establishing a reset pulse priority mode in which the control pulse applied to said reset input terminal is given priority over the control pulse applied to said set input terminal during a span except said predetermined span of said certain period.

13. A pulse width modulation apparatus of claim 12, wherein:

the priority of the control pulses respectively applied to said set input terminal and said reset input terminal of said latch means is changed over by a mode switching signal output from a predetermined position in plural steps of delay elements making up said delay means.

14. A pulse width modulation apparatus in which a control pulse input at a certain period is delayed through arbitrary amounts of time by delay means for applying delayed control pulses to a set input terminal and a reset input terminal of latch means, and the pulse width of an output pulse delivered from said latch means is modulated in accordance with the control pulses applied to said set input terminal and said reset input terminal, wherein:

said delay means comprises first and second groups of delay gates corresponding to first and second halves of said certain period, so that the control pulse delayed through an arbitrary amount of time by said first group of delay gates is output as a set pulse to a set input terminal of said latch means, and the control pulse delayed through an arbitrary amount of time by said second group of delay gates is output as a reset pulse to a reset input terminal of said latch means;

means for switching said latch means over to a set pulse priority mode or a reset pulse priority mode by a mode switching signal; and said mode switching signal is changed over to the reset pulse priority mode by a control signal output from a predetermined position in plural steps of delay elements making up said first group of delay gates, and to the set pulse priority mode by a control signal output from a predetermined position in plural steps of delay elements making up said second group of delay gates.

15. A pulse width modulation apparatus of claim 14 wherein, said latch means comprising:
a first NAND circuit for producing the logical product of an inverted output of said mode switching signal and said set pulse;
a second NAND circuit for producing the logical product of said mode switching signal and said reset pulse;
a first AND circuit for producing the logical product of an output of said second NAND circuit and said set pulse;
a second AND circuit for producing the logical product of an output of said first NAND circuit and said reset pulse; and
a flip-flop circuit having a set input terminal to which an output of said first AND circuit is applied, and a reset input terminal to which an output of said second AND circuit is applied.

16. A pulse width modulation apparatus in which a control pulse input at a certain period is delayed through arbitrary amounts of time by delay means to produce a set pulse and a reset pulse, rising and falling of an output pulse delivered from latch means are controlled to be switched over by said set pulse and said reset pulse, and means for controlling the times of setting and resetting said latch, whereby said latch means generates an output pulse having an arbitrary pulse width and being substantially symmetrical about the center of said period, said pulse width modulation apparatus including output modifying means for:
receiving one of said set pulse and said reset pulse; and
selection means for switching over as to whether said received pulse is applied to said latch means after delay through a unit pulse delay time or not, based on a set value of pulse width setting data for setting a pulse width of said output pulse.

17. A pulse width modulation apparatus of claim 16, said output modifying means:
comprises switching means having a first input terminal to which said set pulse or said reset pulse is directly applied, and a second input terminal to which said set pulse or said reset pulse is applied after delay through a unit pulse delay time; and
modifies a difference in input time between said set pulse and said reset pulse applied to said latch means by a unit pulse delay time by switching over the input terminals of said switching means based on said pulse width setting data.

18. A pulse width modulation apparatus of claim 17, said output modifying means:
controls switching-over as to whether said set pulse or said reset pulse is delayed through a unit pulse delay time or not, by using the least significant bit of said pulse width setting data.

19. A pulse width modulation apparatus delaying a control pulse input at every fixed period for an preselected time period through delay means, providing the delayed control pulse respectively to a set input end and a reset input end of latch means and modulating pulse width of an output pulse output from said latch means on the basis of the control pulse input to the set input end and the reset input end, said pulse width modulation apparatus comprising:
control means for inputting a delay pulse from a delay element positioned at predetermined ordinal stage position of a plurality of stages of delay elements constituting said delay means, said delay pulse being delayed correspondingly to the ordinal stage number, said control means for controlling unit delay time per one stage of said delay elements on the basis of shift in phase between the delay pulse and the control pulse to be input to said delay means.

20. A pulse width modulation apparatus of claim 19, wherein:
said control means controls load on a plurality of stages of delay elements constituting said delay means on the basis of shift in phase between said delay pulse and the control pulse input to said delay means, to control unit delay time per one stage of said delay elements.

21. A pulse width modulation apparatus delaying a control pulse input at every fixed period for an optional time period through delay means, providing the delayed control pulse respectively to a set input end and a reset input end of latch means and modulating pulse width of an output pulse output from said latch means on the basis of a control pulse input to the set input end and the reset input end, said pulse width modulation apparatus comprising:
frequency dividing means for dividing the frequency of the control pulse input to said delay means based on a predetermined frequency dividing ratio;
phase shift means for shifting the phase of the frequency-divided output provided from said frequency dividing means, on the basis of a delay pulse output from a delay element corresponding to said frequency dividing ratio of the plurality of stages of delay elements constituting said delay means; and
means for producing a control signal in response to comparing a delay frequency-divided output provided from said phase shift means and said frequency-divided output to obtain shift in the phase of said delayed frequency-divided output with respect to said frequency-divided output on the basis of the result of the comparison; wherein
said filter means controls bias voltage on the plurality of stages of delay elements constituting said delay means in accordance with the obtained shift in phase, to control unit delay time per one stage of said delay elements.

22. A pulse width modulation apparatus of claim 21, wherein:
said filter means control unit delay time per one stage of said delay elements by controlling bias voltage to be delivered to a current source of emitter follower output stage being a component of said delay means to increase/decrease the emitter current flowing to said emitter follower output stage.

23. A pulse width modulation apparatus, in which a control pulse input at a clock cycle is delayed for an arbitrary period of time through a delay means, delayed control pulses are input to the set input terminal and reset input terminal of a latch means, respectively and the pulse width of an output pulse output from said latch means is modulated based on the control pulses input to said set input terminal and reset input terminal, wherein:

means for selecting a reference position serving as a reference when said output pulse is generated from a plurality of reference positions at each clock cycle; and means supplying said control pulses delayed in accordance with the selected reference position to the set terminal and reset terminal of said latch means.

24. A pulse width modulation apparatus of claim 23, wherein:
said plurality of the reference positions correspond to the center point, start point and end point of said clock cycle, respectively.

25. A pulse width modulation apparatus of claim 23, wherein:
said delay means is composed of multi-stage delay gate groups with a plurality of delay elements connected to each other in series; and
a delay time of said control pulse set to each of said delay gate groups is generated in correspondence to each of said respective delay gate groups based on the same pulse width setting data.

26. A pulse width modulation apparatus, in which a control pulse input at a clock cycle is delayed for an arbitrary period of time through a delay means, delayed control pulses are input to the set input terminal and reset input terminal of a latch means, respectively and the pulse width of an output pulse output from said latch means is modulated based on the control pulses input to said set input terminal and reset input terminal, wherein:

means for selecting a reference position serving as a reference when said output pulse is generated from a plurality of reference positions at each clock cycle;

means supplying said control pulses delayed in accordance with said selected reference position to the set terminal and reset terminal of said latch means; and said output pulse is generated by controlling said latch means by said control pulses, said latch means having a period for providing priority with said control pulse input to said input terminal and a period for providing priority with said control pulse input to said reset input terminal in said clock cycle.

27. A pulse width modulation apparatus of claim 26, wherein:
the priority period of said latch means is switched by a control pulse output from the delay element at a predetermined position of a plurality of delay elements constituting said delay means.

* * * * *